(12) United States Patent
Matsuura et al.

(10) Patent No.: US 7,792,214 B2
(45) Date of Patent: Sep. 7, 2010

(54) POLAR MODULATION TRANSMITTER CIRCUIT AND COMMUNICATIONS DEVICE

(75) Inventors: Toru Matsuura, Osaka (JP); Shigeru Morimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 579 days.

(21) Appl. No.: 11/911,171

(22) PCT Filed: Apr. 26, 2006

(86) PCT No.: PCT/JP2006/309196

§ 371 (c)(1),
(2), (4) Date: Oct. 10, 2007

(87) PCT Pub. No.: WO2006/118317

PCT Pub. Date: Nov. 9, 2006

(65) Prior Publication Data

US 2009/0060089 A1 Mar. 5, 2009

(30) Foreign Application Priority Data

Apr. 27, 2005 (JP) .............................. 2005-129271

(51) Int. Cl.
*H04K 1/02* (2006.01)
*H04L 25/03* (2006.01)
*H04L 25/49* (2006.01)

(52) U.S. Cl. ...................... 375/297; 375/295; 375/300; 375/302; 455/102

(58) Field of Classification Search ................. 375/297, 375/295, 300, 302; 455/102
See application file for complete search history.

(56) References Cited

U.S. PATENT DOCUMENTS 6,366,177 B1   4/2002   McCune et al.
7,359,680 B2 * 4/2008   Klemmer ................. 455/102
7,466,965 B2 * 12/2008  Tanabe .................... 455/102
7,573,949 B2 * 8/2009   Matsuura et al. ............ 375/295
2002/0031191 A1 3/2002  Shimizu
2004/0037364 A1 2/2004  Gagey et al.

FOREIGN PATENT DOCUMENTS

EP      1 170 915      1/2002

OTHER PUBLICATIONS

International Search Report mailed Jul. 26, 2006 in the International (PCT) Application No. PCT/JP2006/309196 of which the present application is the U.S. National Stage.
Written Opinion of the International Searching Authority for PCT/JP2006/309196 mailed Jul. 26, 2006.

* cited by examiner

*Primary Examiner*—Ted M Wang
(74) *Attorney, Agent, or Firm*—Wenderoth, Lind & Ponack, L.L.P.

(57) ABSTRACT

Provided is a transmitter circuit capable of operating with low distortion and high efficiency even in a modulation method using wide modulation bandwidth. In the transmitter circuit, a signal generation section (11) generates an amplitude signal and an angle-modulated signal. Based on a predetermined characteristic, a compensating filter (12) wave-shaping-processes the amplitude signal. A regulator (14) outputs a signal in accordance with a magnitude of the signal which has been wave-shaping-processed by the compensating filter (12). An amplitude modulator section (15) amplitude-modulates the angle-modulated signal by using the signal outputted from the regulator (14). A characteristic of the compensating filter (12) is an inverse of a transfer characteristic between an input at the regulator (14) and an output at the amplitude modulator section (15).

13 Claims, 20 Drawing Sheets

F I G. 1 4 B
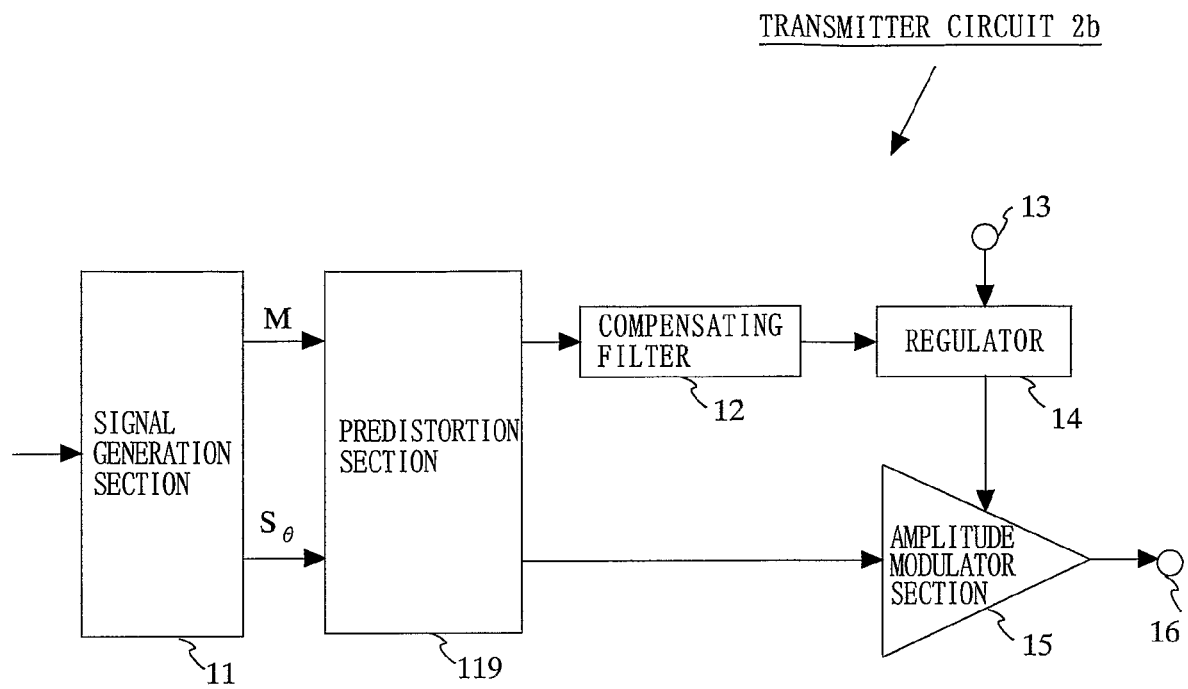

FIG. 26 PRIOR ART
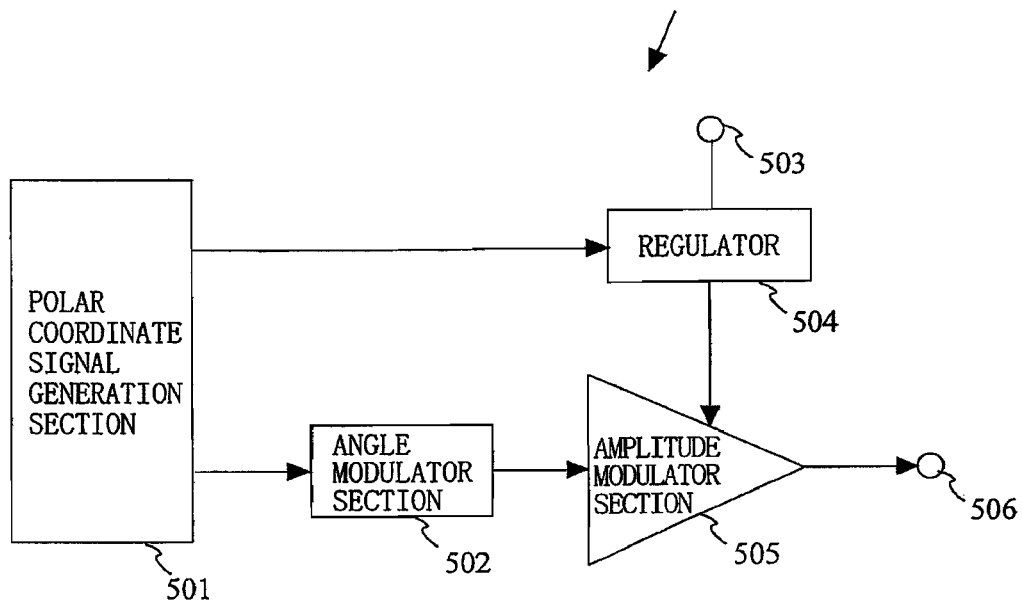
FIG. 27 PRIOR ART
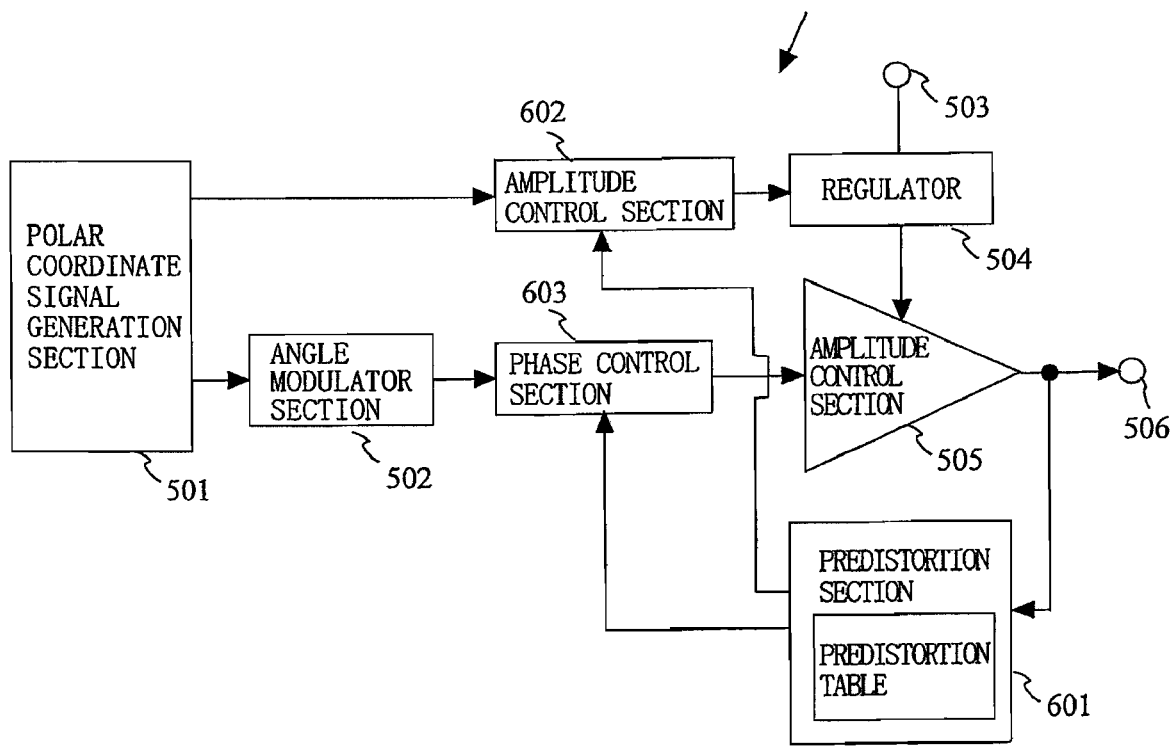

FIG. 28 PRIOR ART
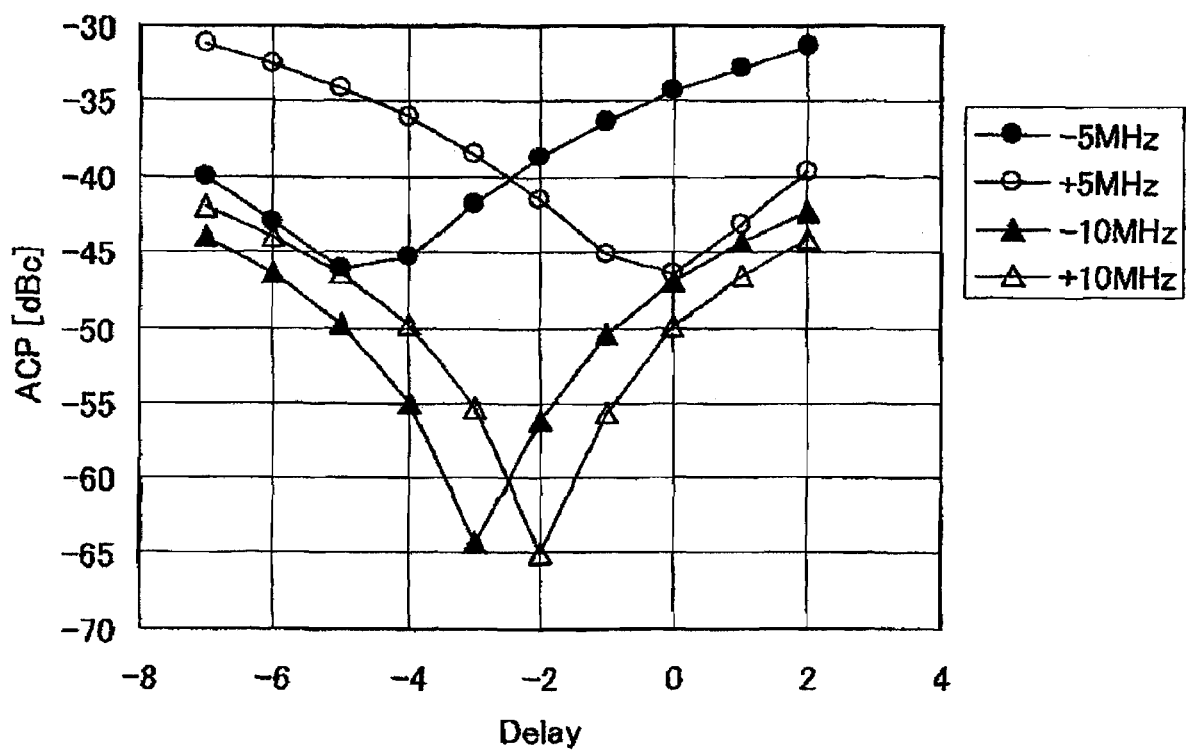

US 7,792,214 B2

POLAR MODULATION TRANSMITTER CIRCUIT AND COMMUNICATIONS DEVICE

TECHNICAL FIELD

The present invention relates to a transmitter circuit for use in a communications device such as a mobile telephone, a wireless LAN device, and the like and more particularly, to a transmitter circuit capable of outputting a transmitted signal with low distortion and high efficiency in a modulation method which has wide modulation bandwidth and a communications device using the transmitter circuit.

BACKGROUND ART

Conventionally, as a radio frequency power amplifier for amplifying a modulated signal with varying envelope, Class A or Class AB linear amplifier had been used in order to amplify the signal with varying envelope in a linear manner. Whereas these linear amplifiers are excellent in linearity, power efficiency of the linear amplifiers is low as compared with Class C to E non-linear amplifiers. Consequently, when these radio frequency power amplifiers are applied to a mobile communications device whose power source is a battery, due to a large power consumption of the radio frequency power amplifiers, there accrues a problem of a shorter operating time. In addition, when these radio frequency amplifiers are applied to a base station device of a wireless system in which a plurality of transmitter circuits outputting a large amount of power are mounted, problems of increases in size of the device and in power dissipation will arise.

Consequently, as a transmitter circuit capable of operating with high efficiency, a transmitter circuit in which a polar modulation method is employed has been proposed. FIG. 26 is a block diagram illustrating an exemplary configuration of a conventional transmitter circuit 500 in which the polar modulation method is employed. In FIG. 26, the conventional transmitter circuit 500 includes a polar coordinate signal generation section 501, an angle modulator section 502, a power source terminal 503, a regulator 504, an amplitude modulator 505, and an output terminal 506.

The polar coordinate signal generation section 501 generates an amplitude signal and a phase signal. The amplitude signal is inputted to the regulator 504. A DC voltage is supplied to the regulator 504 from the power source terminal 503. The regulator 504 supplies to the amplitude modulator 505 a voltage in accordance with the inputted amplitude signal. And the phase signal is inputted to the angle modulator section 502. The angle modulator section 502 angle-modulates the inputted phase signal and outputs an angle-modulated signal. The angle-modulated signal outputted from the angle modulator section 502 is inputted to the amplitude modulator section 505. The amplitude modulator section 505 amplitude-modulates the angle modulated signal with the voltage supplied from the regulator 504 to output a modulated signal. This modulated signal is outputted as a transmitted signal from the output terminal 506.

And in the transmitter circuit with the polar modulation method employed, distortion of the transmitted signal may occur due to non-linearity of the regulator 504 and the amplitude modulator section 505. For the transmitter circuit with the polar modulation method employed, a method for compensating the non-linearity of the regulator 504 and the amplitude modulator section 505 by using a table has conventionally been disclosed (for example, refer to U.S. Pat. No. 6,366, 177). As a conventional transmitter circuit using such a method, there is, for example, a transmitter circuit 600 shown in FIG. 27. FIG. 27 is a block diagram illustrating an exemplary configuration of the conventional transmitter circuit 600. In FIG. 27, a predistortion section 601, based on a transmitted signal, produces a predistortion table so as to compensate the non-linearity of the regulator 504 and the amplitude modulator section 505. An amplitude control section 602 and a phase control section 603, based on the predistortion table produced by the predistortion section 601, previously distorts an amplitude signal and a phase signal to be inputted to the regulator 504 and the amplitude modulator section 505.

In recent years, however, wider modulation bandwidth of a transmitter circuit has been desired and consequently, it is anticipated that frequency bandwidth of the regulator 504 and the amplitude modulator section 505 would become insufficient. For example, when the frequency bandwidth of the regulator 504 and the amplitude modulator section 505 are insufficient, the conventional transmitter circuit 500 (refer to FIG. 26) has a problem such as distortion of a transmitted signal. As one example of such a problem, a result of simulating a case where in the transmitter circuit 500, the frequency bandwidth of the regulator 504 and the amplitude modulator section 505 are insufficient is shown in FIG. 28. In this case, as a modulated signal, a modulated wave, in a $\pi/4$-shift QPSK method, having 512 of a symbol number, 128 of oversampling, $\alpha=0.5$ of a root-raised filter, and 3.84 MHz of a symbol rate is used. And a transfer characteristic between the regulator 504 and the amplitude modulator section 505 is made same as a characteristic of a low-pass filter having a linear attenuation characteristic whose cutoff frequency is 26.4 MHz.

Under the above-mentioned conditions, a value of an adjacent channel power ratio (ACP) in a case where integral bandwidth is 3.84 MHz and detunings are 5 MHz and 10 MHz is calculated and this result is shown in FIG. 28. In FIG. 28, a horizontal axis (in other words, Delay) is a delay time between an amplitude signal and a phase signal and a unit is a number of samples. For example, a delay in one sample corresponds to 2 ns. And an ACP for detuning of −5 MHz is an ACP at a point where a frequency is 5 MHz lower than a center frequency. Judging from this result, it turns out that even when a delay time, caused by a difference in paths, between the amplitude signal and the phase signal is adjusted, ACPs cannot be sufficiently reduced and an optimum delay time for ACPs depends on detuning, making it difficult to sufficiently reduce all ACPs.

In addition, even when in a transmitter circuit 600 (refer to FIG. 27), non-linearity of the regulator 504 and the amplitude modulator section 505 is compensated, it is difficult to suppress distortion caused by insufficient bandwidth of the regulator 504 and the amplitude modulator section 505.

Therefore, an object of the present invention is to provide a transmitter circuit capable of operating with low distortion and high efficiency in a modulation method in which modulation bandwidth is wide and a communications device using the transmitter circuit.

DISCLOSURE OF THE INVENTION

An object of the present invention is directed to a transmitter circuit for generating and outputting a transmitted signal based on inputted data. And to achieve the above-mentioned object, the transmitter circuit of the present invention comprises: a signal generation section for generating an amplitude signal and an angle-modulated signal based on an amplitude component and a phase component which are obtained by signal-processing the inputted data; a compensating filter for wave-shaping-processing the amplitude signal based on a predetermined characteristic of the compensating filter; a regulator for outputting a signal in accordance with a magnitude of the signal which has been wave-shaping-processed by the compensating filter; and an amplitude modulator section for, by using the signal outputted from the regulator, amplitude-modulating the angle-modulated signal to be outputted as a modulated signal therefrom, and in the transmitter circuit, the predetermined characteristic of the compensating filter is an inverse of a transfer characteristic between an input at the regulator and an output at the amplitude modulator section.

Preferably, the signal generation section includes a polar coordinate signal generation section for generating the amplitude signal and a phase signal based on the amplitude component and the phase component which are obtained by signal-processing the data, and an angle modulator section for angle-modulating the phase signal to be outputted as the angle-modulated signal therefrom.

The signal generation section may include: a quadrature signal generation section for generating an in-phase signal and a quadrature-phase signal by signal-processing the data; a vector modulator section for vector-modulating the in-phase signal and the quadrature-phase signal; an envelope detection section for detecting an envelope component of the signal outputted from the vector modulator section and outputting the detected component as the amplitude signal; and a limiter for limiting, to a predetermined magnitude, an envelope of the signal outputted from the vector modulator section and outputting, as the angle-modulated signal, the signal whose magnitude is limited.

Preferably, the compensating filter includes a digital filter for wave-shaping-processing the amplitude signal based on the predetermined characteristic and a DA converter for converting to an analog signal the signal outputted from the digital filter.

The compensating filter may include a DA converter for converting the amplitude signal to an analog signal and an analog filter for wave-shaping-processing the analog signal based on the predetermined characteristic.

Preferably, the regulator is a series regulator. This allows the transmitter circuit to process a signal having wide bandwidth.

The regulator may be a switching regulator. This allows the transmitter circuit to operate with high efficiency.

Downstream of an output from the polar coordinate signal generation section, the transmitter circuit may further include a predistortion section for compensating distortion, of at least either of the amplitude signal or the phase signal, caused at any of the regulator, the angle modulator section, and the amplitude modulator section.

Preferably, the signal generation section further outputs power information which is set based on a base band section of the transmitter circuit. In this case, the regulator includes a switching regulator and a series regulator. The switching regulator supplies to the series regulator a voltage controlled by the power information. The series regulator outputs, while applying the voltage supplied from the switching regulator, a signal in accordance with a magnitude of the signal which has been wave-shaping-processed by the compensating filter. This allows a reduction in a loss at the series regulator and in power consumption.

Preferably, a transfer characteristic of the compensating filter is constant irrespective of a magnitude of the amplitude signal. When the signal generation section further outputs the power information which is set based on the base band section of the transmitted circuit, the transfer characteristic of the compensating filter may be changed in accordance with a magnitude of the power information. This allows the transmitter circuit to suppress distortion caused by insufficient frequency bandwidth of the regulator and the amplitude modulator section irrespective of a magnitude of the transmitted signal outputted by the amplitude modulator section.

Also the present invention is directed to a communications device including the transmitter circuit above described. The communications device includes the transmitter circuit for generating a transmitted signal and an antenna for outputting the transmitted signal generated by the transmitter circuit. The communications device may further include a receiver circuit for processing a received signal received from the antenna and an antenna duplexer for outputting to the antenna the transmitted signal generated in the transmitter circuit and outputting to the receiver circuit the signal received from the antenna.

As described above, according to the present invention, the compensating filter compensates the amplitude signal outputted by the signal generation section so as to have an inverse characteristic of a transfer characteristic between an input at the regulator and an output at the amplitude modulator section, thereby suppressing distortion caused by insufficient frequency bandwidth of the regulator and the amplitude modulator section. Thus, the transmitter circuit is capable of outputting a transmitted signal with low distortion and high efficiency even in a modulation method in which modulation bandwidth is wide.

And the transmitter circuit further includes a predistortion section for compensating non-linearity of at least any of the angle modulator section, the regulator, and the amplitude modulator section. The predistortion section compensates non-linearity of at least any of the angle modulator section, the regulator, and the amplitude modulator section, and thereby suppresses the distortion caused by the insufficient frequency bandwidth of the regulator and the amplitude modulator section, thus making it possible to output a transmitted signal having the distortion reduced.

In addition, according to a communications device of the present invention, the communications device, by using the transmitter circuit described above, is capable of ensuring an accuracy of an outputted signal in wide bandwidth and operating while achieving high efficiency and downsizing.

BRIEF DESCRIPTION OF THE DRAWINGS

FIG. 4 is a block diagram illustrating an exemplary configuration of a series regulator 14a.

FIG. 7 is a block diagram illustrating an exemplary configuration of an amplitude modulator section 15a.

FIG. 14B is a block diagram illustrating an exemplary configuration of a transmitter circuit 2b according to the second embodiment of the present invention.

FIG. 26 is a block diagram illustrating a configuration of a conventional transmitter circuit 500.

FIG. 27 is a block diagram illustrating an exemplary configuration of a conventional transmitter circuit 600.

FIG. 28 is a diagram showing a simulation result obtained when frequency bandwidth of a regulator 504 and an amplitude modulator section 505 are insufficient.

BEST MODE FOR CARRYING OUT THE INVENTION

First Embodiment

Figure 1:
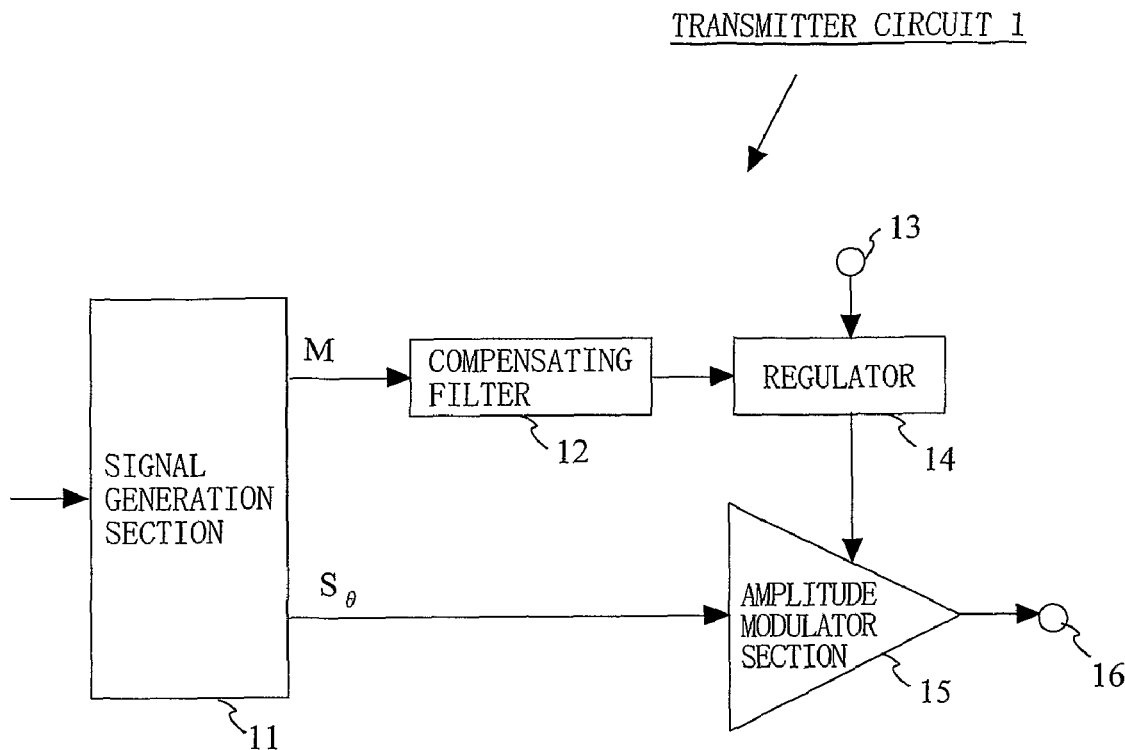
FIG. 1 is a block diagram illustrating an exemplary configuration of a transmitter circuit according to a first embodiment of the present invention.

FIG. 1 is a block diagram illustrating an exemplary configuration of a transmitter circuit 1 according to a first embodiment of the present invention. In FIG. 1, the transmitter circuit 1 includes a signal generation section 11, a compensating filter 12, a power source terminal 13, a regulator 14, an amplitude modulator section 15, and an output terminal 16. The signal generation section 11, based on an amplitude component and a phase component obtained by signal-processing input data, outputs an amplitude signal M and an angle-modulated signal $S_\theta$. The amplitude signal M is wave-shaping-processed and thereafter is inputted to the regulator 14. The regulator 14 outputs a signal controlled by the inputted amplitude signal. Typically, the regulator 14 outputs a signal in proportion to a magnitude of the inputted amplitude signal. The signal outputted by the regulator 14 is inputted to the amplitude modulator section 15.

The angle-modulated signal $S_\theta$ is inputted to the amplitude modulator section 15. The amplitude modulator section 15 amplitude-modulates the angle-modulated signal $S_\theta$, using the signal inputted from the regulator 14, to be outputted as a modulated signal which has been angle-modulated and amplitude-modulated. The modulated signal is outputted as a transmitted signal from the output terminal 16.

Next, each configuration of the signal generation section 11, the regulator 14, the amplitude modulator section 15, and the compensating filter 12, in this order, will be described in detail.

Figure 2:
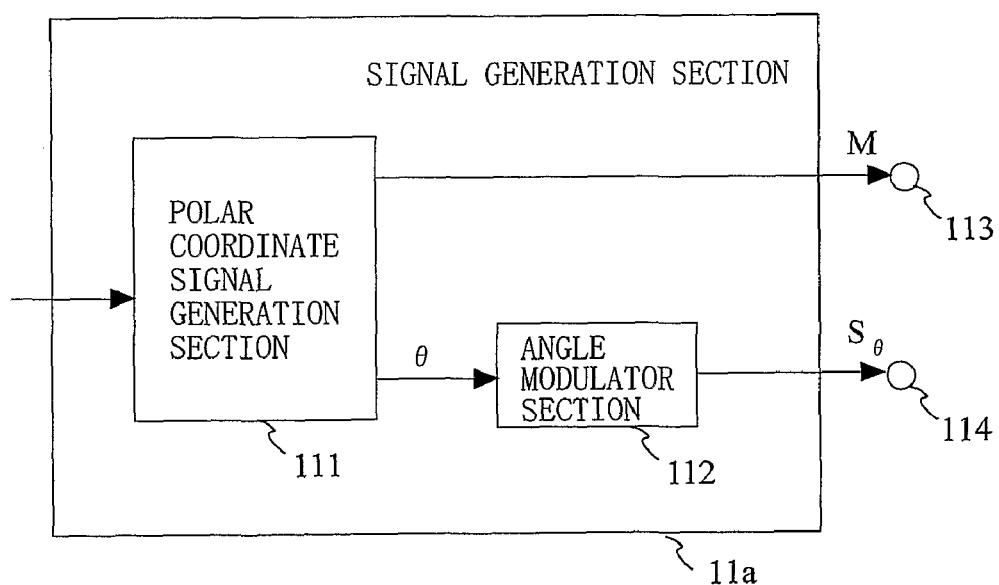
FIG. 2 is a block diagram illustrating an example of a signal generation section 11a including a polar coordinate signal generation section.

The signal generation section 11, for example, may include a polar coordinate signal generation section for generating a polar coordinate signal. FIG. 2 is a block diagram illustrating an example of a signal generation section 11a including the polar coordinate generation section. In FIG. 2, the signal generation section 11a includes a polar coordinate signal generation section 111, an angle modulator section 112, an output terminal 113, and an output terminal 114. The polar coordinate signal generation section 111 modulates input data and generates an amplitude signal M and a phase signal θ. The amplitude signal M is outputted from the output terminal 113. The phase signal θ is angle-modulated by the angle modulator section 112 and thereafter is outputted as an angle-modulated signal $S_\theta$ from the output terminal 114.

Figure 3:
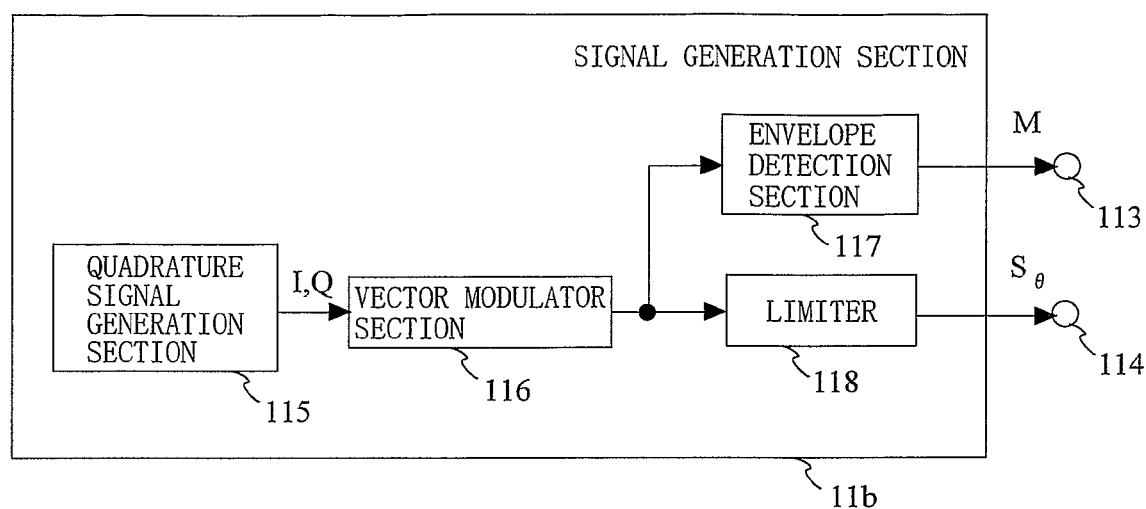
FIG. 3 is a block diagram illustrating an example of a signal generation section 11b including a quadrature signal generation section.

And the signal generation section 11, for example, may include a quadrature signal generation section for generating a quadrature signal. FIG. 3 is a block diagram illustrating an example of a signal generation section 11b including the quadrature signal generation section. In FIG. 3, the signal generation section 11b includes a quadrature signal generation section 115, a vector modulator section 116, an envelope detection section 117, a limiter 118, an output terminal 113, and an output terminal 114. The quadrature signal generation section 115 generates a baseband signal including an in-phase signal and a quadrature-phase signal, which are quadrature data. The in-phase signal and the quadrature-phase signal are inputted to the vector modulator section 116. The vector modulator section 116 vector-modulates the in-phase signal and the quadrature-phase signals. As the vector modulator section 116, for example, a quadrature modulator is used.

A signal outputted from the vector modulator section 116 is inputted to the envelope detection section 117 and the limiter 118. The envelope detection section 117 detects an envelope component of the signal, outputted from the vector modulator section 116, to be outputted as an amplitude signal M from the output terminal 113. The limiter 118 limits to a constant the envelope component of the signal outputted from the vector modulator section 116 and thus the magnitude-limited signal is outputted as an angle-modulated signal $S_\theta$ from the output terminal 114.

Figure 4:
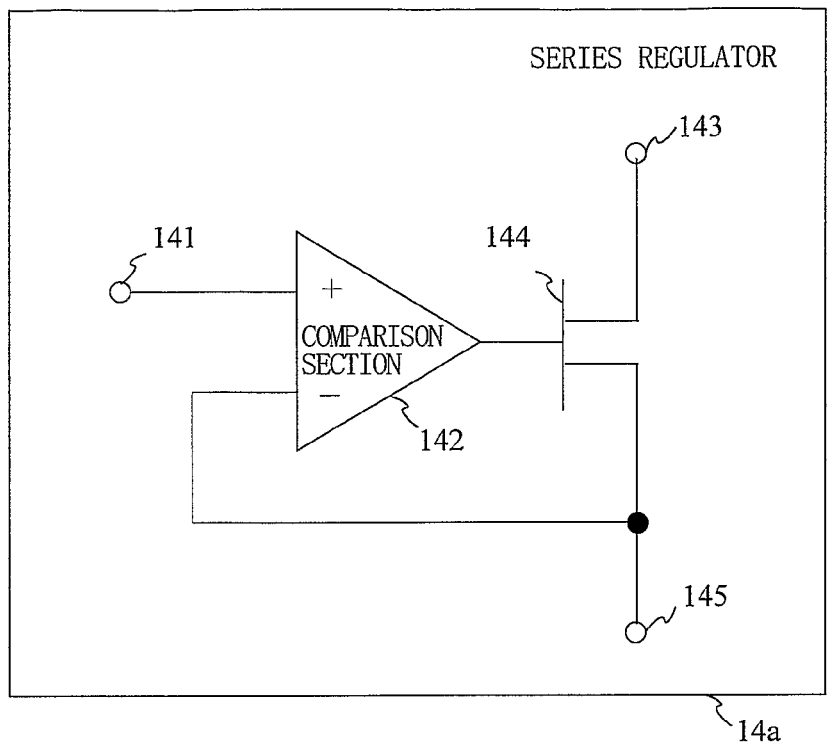

The regulator 14, for example, may be a voltage-driven type series regulator. FIG. 4 is a block diagram illustrating an exemplary configuration of a series regulator 14a. In FIG. 4, the series regulator 14a includes an input terminal 141, a comparison section 142, a power source terminal 143, a transistor 144, and an output terminal 145. Here, the transistor 144 is a field-effect transistor. Inputted to the input terminal 141, via the compensating filter 12, is an amplitude signal. The amplitude signal is inputted via the comparison section 142 to a gate terminal. A DC voltage from the power source terminal is supplied to a drain terminal of the transistor.

The transistor 144 outputs from a source terminal a voltage in proportion to a magnitude of the inputted amplitude signal. The voltage outputted from the source terminal of the transistor 144 is fed back to the comparison section 142. The comparison section 142, based on the feedback voltage, adjusts a magnitude of the amplitude signal inputted to the gate terminal of the transistor 144. As described above, the series regulator 14a can supply from the output terminal 145 the voltage controlled in accordance with the magnitude of the amplitude signal in a stable manner. In the meantime, even if the transistor 144 is a bipolar transistor, similar effect can be obtained.

Figure 5:
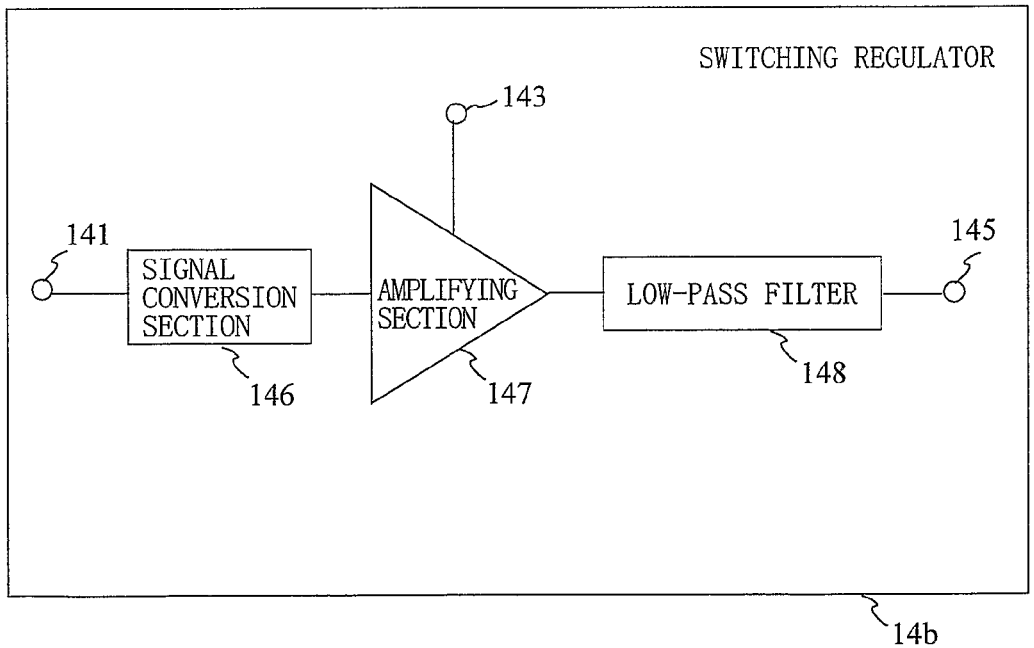
FIG. 5 is a block diagram illustrating an exemplary configuration of a switching regulator 14b.

In addition, the regulator 14, for example, may be a voltage-driven type switching regulator. FIG. 5 is a block diagram illustrating an exemplary configuration of the switching regulator 14b. In FIG. 5, the switching regulator 14b includes an input terminal 141, a power source terminal 143, a signal conversion section 146, an amplifying section 147, a low-pass filter 148, and an output terminal 145. Inputted to the input terminal 141, via the compensating filter 12, is an amplitude signal. The amplitude signal is inputted to the signal conversion section 146. The signal conversion section 146 converts the inputted amplitude signal to a PWM signal or a delta-sigma-modulated signal. The signal converted by the signal conversion section 146 is inputted to an amplifying section 147. The amplifying section 147 amplifies the inputted signal to be outputted therefrom. A DC voltage is supplied to the amplifying section 147 from the power source terminal 143. As the amplifying section 147, a high-efficiency switching amplifier such as Class D amplifier is used.

The signal outputted by the amplifying section 147 is inputted to a low-pass filter 148. The low-pass filter 148 removes from the signal outputted by the amplifying section 147 a spurious component such as quantization noise and switching noise. The signal having the spurious component removed by the low-pass filter 148 is outputted from the output terminal 145 as a voltage controlled in accordance with a magnitude of the amplified signal. In order to stabilize the outputted voltage, the switching regulator 14b may feed back to the signal conversion section 146 the signal outputted from the low-pass filter 148. In the transmitter circuit 1, a reduction in power consumption is enabled by using the high-efficiency switching regulator 14b as the regulator 14.

Figure 6:
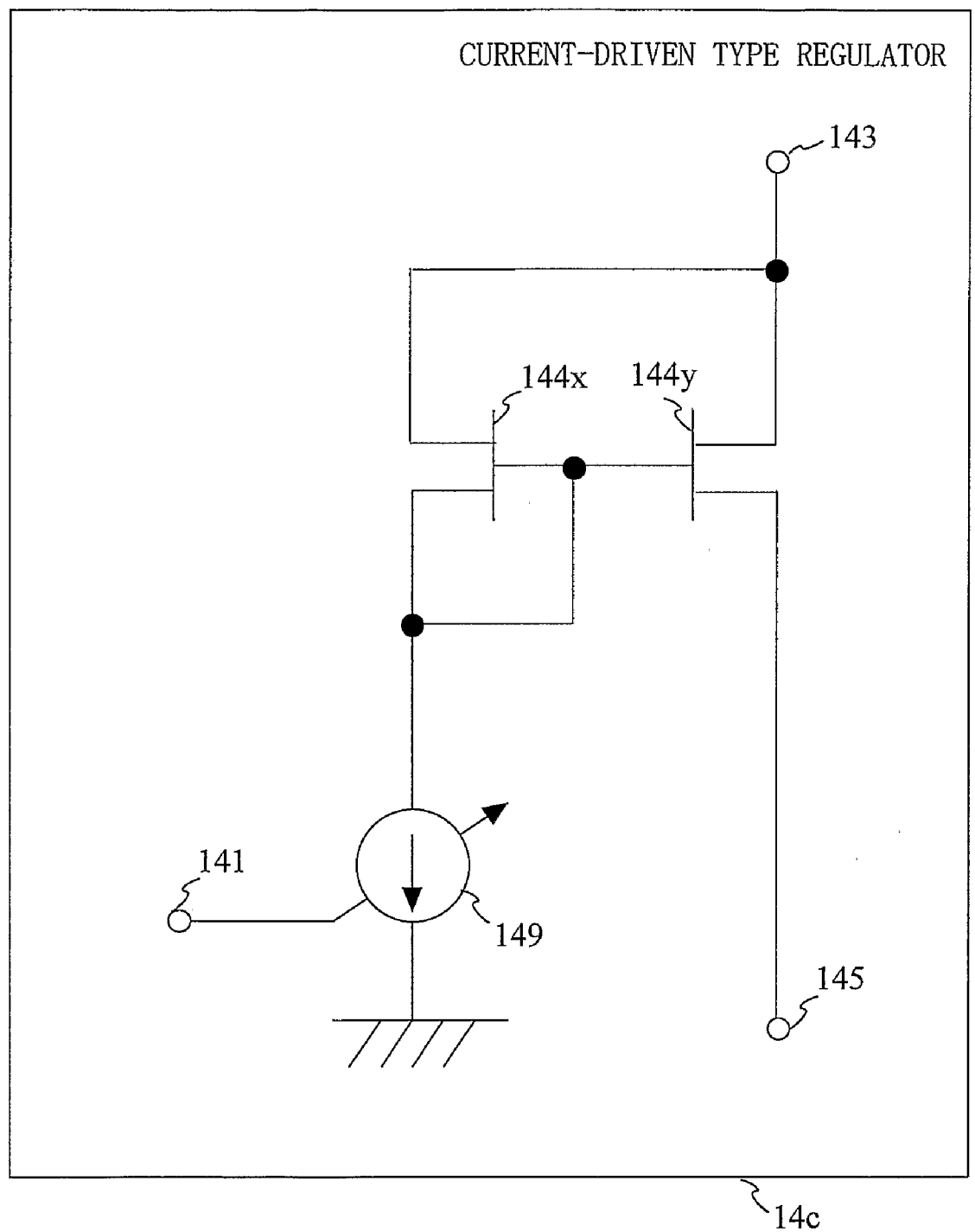
FIG. 6 is a block diagram illustrating an exemplary configuration of a current-driven type regulator 14c.

And the regulator 14, for example, may be a current-driven type regulator. FIG. 6 is a block diagram illustrating an exemplary configuration of a current-driven type regulator 14c. In FIG. 6, the current-driven type regulator 14c includes an input terminal 141, a power source terminal 143, a variable current source 149, a transistor 144x, a transistor 144y, and an output terminal 145. Inputted to the input terminal 141, via the compensating filter 12, is an amplitude signal. A DC voltage is supplied to the power source terminal 143. The inputted amplitude signal is outputted from the output terminal 145, as a current controlled in accordance with a magnitude of the amplitude signal, via the variable current source 149, the transistor 144x, and the transistor 144y. Such a current-driven type regulator 14c is useful when the amplifying section 15 includes a bipolar transistor. In the meantime, irrespective of whether the transistors 144x and 144y are field-effect transistors or bipolar transistors, similar effect can be obtained.

Figure 7:
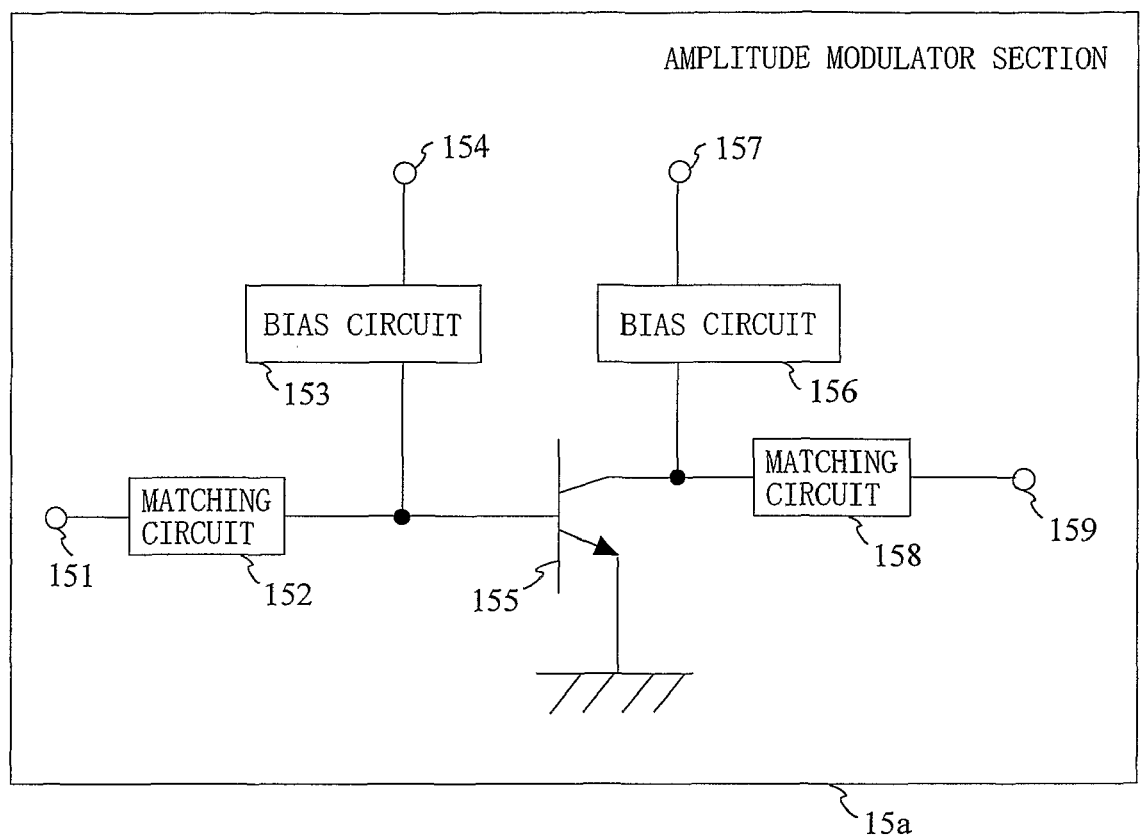

A configuration of the amplifying section 15 may be, for example, as shown in FIG. 7. FIG. 7 is a block diagram illustrating an exemplary configuration of an amplitude modulator section 15a. In FIG. 7, the amplitude modulator 15a includes an input terminal 151, a matching circuit 152, a bias circuit 153, a power source terminal 154, a transistor 155, a bias circuit 156, an input terminal 157, a matching circuit 158, and an output terminal 159. Here, the transistor 155 is a bipolar transistor. Inputted to the input terminal 151 is an angle-modulated signal $S_\theta$ from the signal generation section. The angle-modulated signal $S_\theta$ is inputted via the matching circuit 152 to a base terminal of the transistor 155.

And a DC voltage is applied to the power source terminal 154. In other words, a bias voltage is supplied via the power source terminal 154 and the bias circuit 153 to the base terminal of the transistor 155. Inputted to the input terminal 157 is a signal, controlled in accordance with a magnitude of the amplitude signal, from the regulator 17. The signal controlled in accordance with the magnitude of the amplitude signal is inputted via the bias circuit 156 to a collector terminal of the transistor 155. By using a signal controlled in accordance with the magnitude of the amplitude signal, the transistor 155 amplitude-modulates an angle-modulated signal $S_\theta$ to be outputted as a modulated signal which has been angle-modulated and amplitude-modulated.

The modulated-signal outputted from the transistor 155 is outputted via the matching circuit 158 from the output terminal 159. In the meantime, even if the transistor 155 is a field-effect transistor, similar effect can be obtained. And in the amplitude modulator section 15a, a signal inputted to the power source terminal 154 and a signal inputted to the input terminal 157 may be interchanged and also in this case, similar effect can be obtained.

Figure 8:
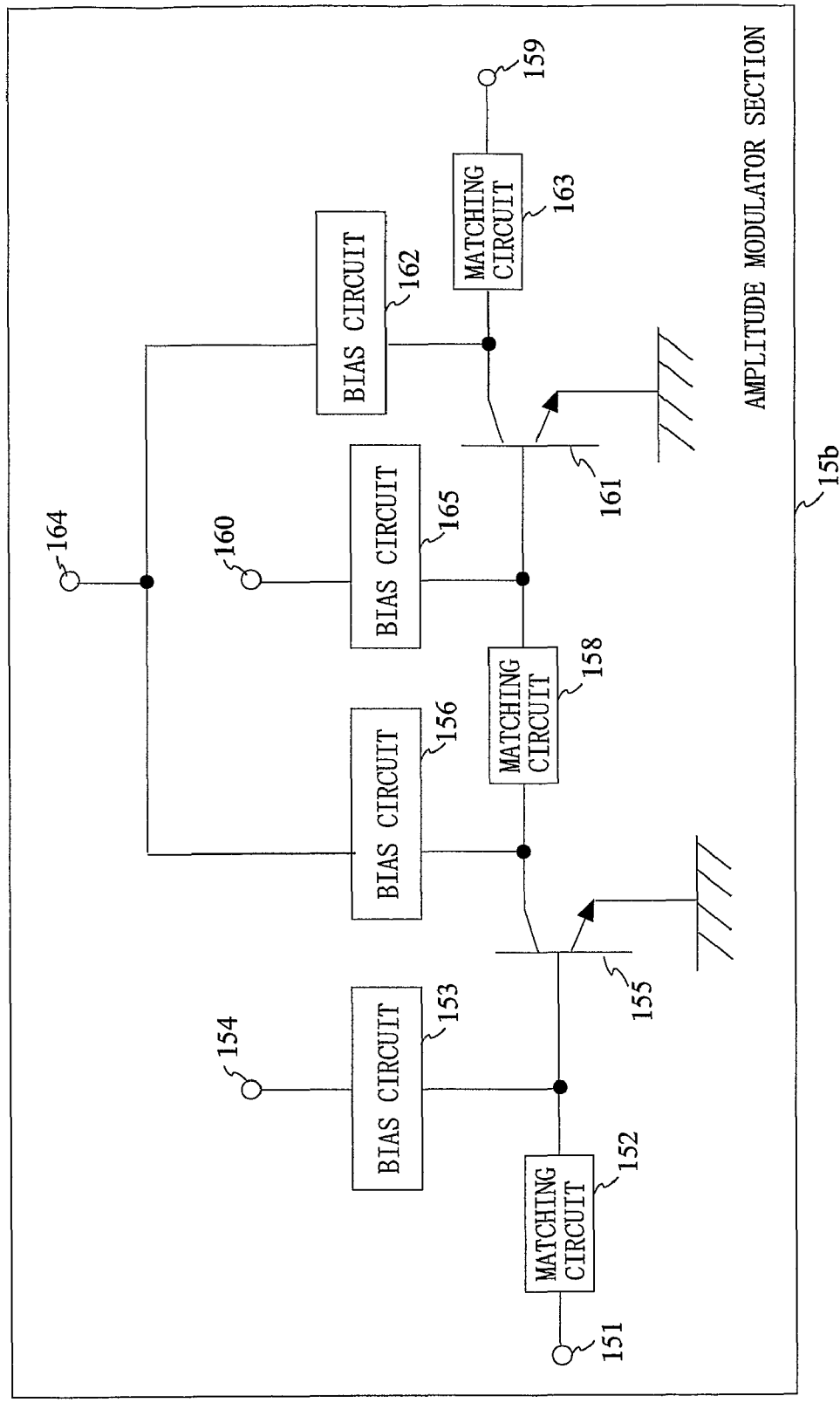
FIG. 8 is a block diagram illustrating an exemplary configuration of an amplitude modulator section 15b.

A configuration of the amplitude modulator section 15 may be different from the configuration of the above-mentioned amplitude modulator 15a described above. FIG. 8 is a block diagram illustrating an exemplary configuration of an amplitude modulator section 15b. In FIG. 8, basically, in the configuration of the amplitude modulator section 15b, two amplitude modulator sections 15a (refer to FIG. 7) are connected in series. Inputted to a base terminal of the transistor 155, via the bias circuit 153, is a bias voltage from the power source terminal 154. Inputted to a base terminal of the transistor 161, via a bias circuit 165, is a bias voltage from a power source terminal 160.

Inputted to a collector terminal of the transistor 155, via a terminal 164 and the bias circuit 156, is a signal controlled in accordance with a magnitude of the amplitude signal from the regulator 17. And inputted to a collector terminal of the transistor 161 from the regulator 17, via a terminal 164 and a bias circuit 162, is a signal in accordance with a magnitude of the amplitude signal. This configuration enables the amplitude modulator section 15b to output a signal having a larger dynamic range than that of a signal outputted from the amplitude modulator section 15a shown in FIG. 7. Although in the amplitude modulator sections 15a and 15b, the transistors are bipolar transistors, even if the transistors are field-effect transistors, similar effect can be obtained.

Next, the compensating filter 12 will be described in detail. The compensating filter 12, by wave-shaping-processing an amplitude signal M, compensates distortion (hereinafter, such distortion is referred to as a frequency characteristic) caused by insufficient frequency bandwidth of the regulator 14 and the amplitude modulator section 15. Here, a method for designing the compensating filter 12 will be described.

In order to design the compensating filter 12, first it is necessary to obtain a transfer characteristic H (s) from an input at the regulator 14 to an output at the amplitude modulator section 15. The transfer characteristic H(s) is defined by an equation (1) using an input signal X(s) to the regulator and an envelope component Y(s) of an output signal from the amplitude modulator 15.

$$H(s)=Y(s)/X(s) \quad (1)$$

Figure 9:
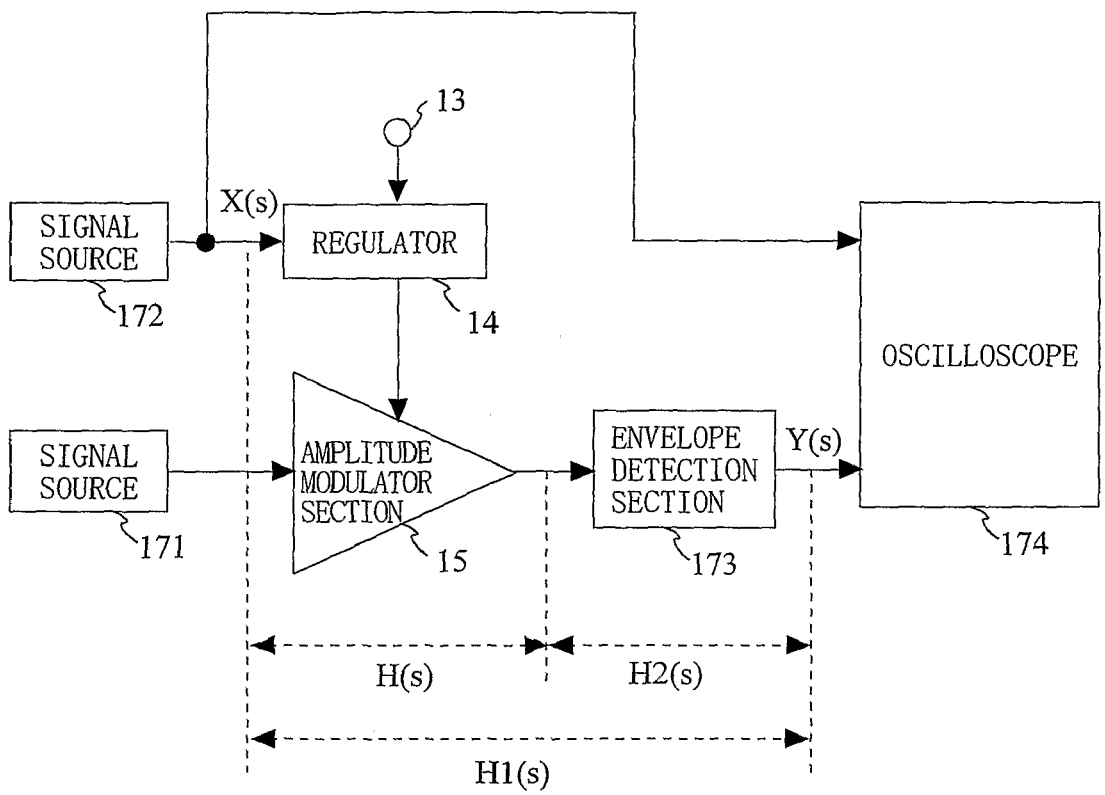
FIG. 9 is a diagram showing a method for obtaining a transfer characteristic H(s) between an input at the regulator 14 and an output at the amplitude modulator section 15.

FIG. 9 is a diagram showing a method for obtaining the transfer characteristic H(s) between the input at the regulator 14 and the output at the amplitude modulator section 15. In FIG. 9, sinusoidal signals are outputted from a signal source 171 and a signal source 172. Here, a frequency of the sinusoidal signal outputted by the signal source 171 is set to be equal to a center frequency of the angle-modulated signal $S_\theta$ outputted by the signal generation section 11 (refer to FIG. 1). And a frequency of the sinusoidal signal outputted by the signal source 172 is set to include any of frequencies which the amplitude signal M outputted by the signal generation section 11 (refer to FIG. 1) has. As the signal outputted from the signal source 172, a step signal or the like may be used.

The sinusoidal signal outputted from the signal source 171 is inputted to the amplitude modulator section 15. On the other hand, the sinusoidal signal outputted from the signal source 172 is amplified by the regulator 14 and thereafter inputted to the amplitude modulator section 15. The amplitude modulator section 15 amplitude-modulates the sinusoidal signal outputted from the signal source 171 by using the sinusoidal signal inputted via the regulator 14 and outputs the signal as a modulated signal. The envelope detection section 173 detects an envelope component of the modulated signal outputted from the amplitude modulator section 15 and outputs the detected envelope component as an envelope signal Y(s) to an oscilloscope 174. As the envelope detection section 17, an envelope detection section whose transfer characteristic is well-known is used.

And inputted to the oscilloscope 174 is the sinusoidal signal, as the input signal X(s) to the regulator, from the signal source 172. In other words, the envelope signal Y(s) is measured by the oscilloscope 174 and the frequency of the input signal X(s) to the regulator 14 is swept, whereby the transfer characteristic H1(s) from the input at the regulator 14 to the output at the envelope detection section 173 can be obtained. Here, when a transfer characteristic of the envelope detection section 173 is defined as H2 (s), the transfer characteristic H(s) from the input at the regulator 14 to the output at the amplitude modulator section 15 is expressed by an equation (2).

$$H(s)=H1(s)/H2(s) \quad (2)$$

Here, when the transfer characteristic H(s) has a linear transfer characteristic, the compensating filter 12 is designed so as to satisfy an equation (3), wherein $\omega_0$ is a constant expressing a cutoff frequency and $s=j\omega$.

$$H(s)=1/(1+s/\omega_0) \quad (3)$$

Figure 10:
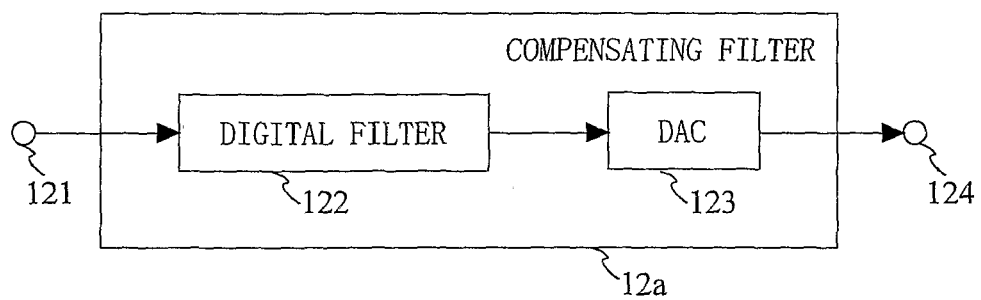
FIG. 10 is a block diagram illustrating an example of a compensating filter 12a including a digital filter.

The compensating filter 12, for example, may include a digital filter. FIG. 10 is a block diagram illustrating an example of a compensating filter 12a including the digital filter. In FIG. 10, the compensating filter 12a includes an input terminal 121, a digital filter 122, a DA converter 123, and an output terminal 124. The compensating filter 12a compensates, using the digital filter 122, the amplitude signal M inputted via the input terminal 121 and converts, using the DA converter 123, the signal to an analog signal to be outputted from the output terminal 124.

If the equation (3) is expressed in a digital manner (in other words, expressed as a function of z), an equation (4) can be obtained. Here, T is a reciprocal of a clock frequency.

$$H(z)=(1-\exp(-\omega_0 T))/(1-\exp(-\omega_0 T)\cdot z^{-1}) \quad (4)$$

Since the transfer characteristic Hc(z) of the compensating filter 12a is an inverse characteristic of the transfer characteristic H(z) from the input at the regulator 14 to the output at the amplitude modulator section 15, the transfer characteristic Hc(z) of the compensating filter 12a can be expressed in an equation (5). The transfer characteristic Hc(z) of the compensating filter 12a according to the first embodiment is, as shown in the equation (5), constant irrespective of a magnitude of the amplitude signal M.

$$Hc(z) = H(z)^{-1} \quad (5)$$
$$= (1-\exp(-\omega_0 T)\cdot z^{-1})/(1-\exp(-\omega_0 T))$$

Figure 11:
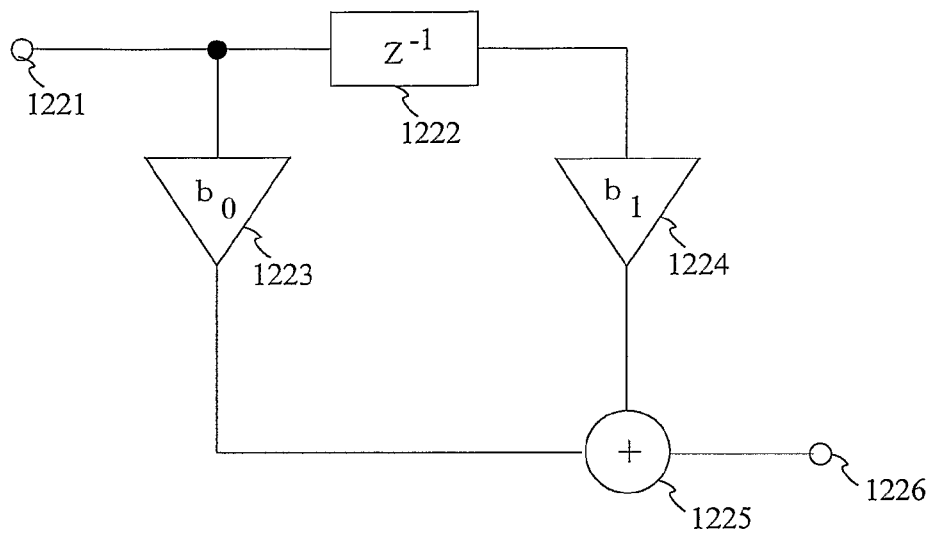
FIG. 11 is a block diagram illustrating an exemplary configuration of an FIR filter.

And the compensating filter 12a may be an FIR filter shown in FIG. 11. FIG. 11 is a block diagram illustrating an exemplary configuration of the FIR filter. The FIR filter shown in FIG. 11 includes an input terminal 1221, a delay element 1222, multipliers (product devices) 1223 and 1224, an adder 1225, and an output terminal 1226. In FIG. 11, coefficients $b_0$ and $b_1$ of the multipliers 1223 and 1224 can be expressed in equations (6) and (7).

$$b_0=1-\exp(-\omega_0 T)\cdot z^{-1} \quad (6)$$

$$b_1=\exp(-\omega_0 T)/(1-\exp(-\omega_0 T)) \quad (7)$$

Figure 12:
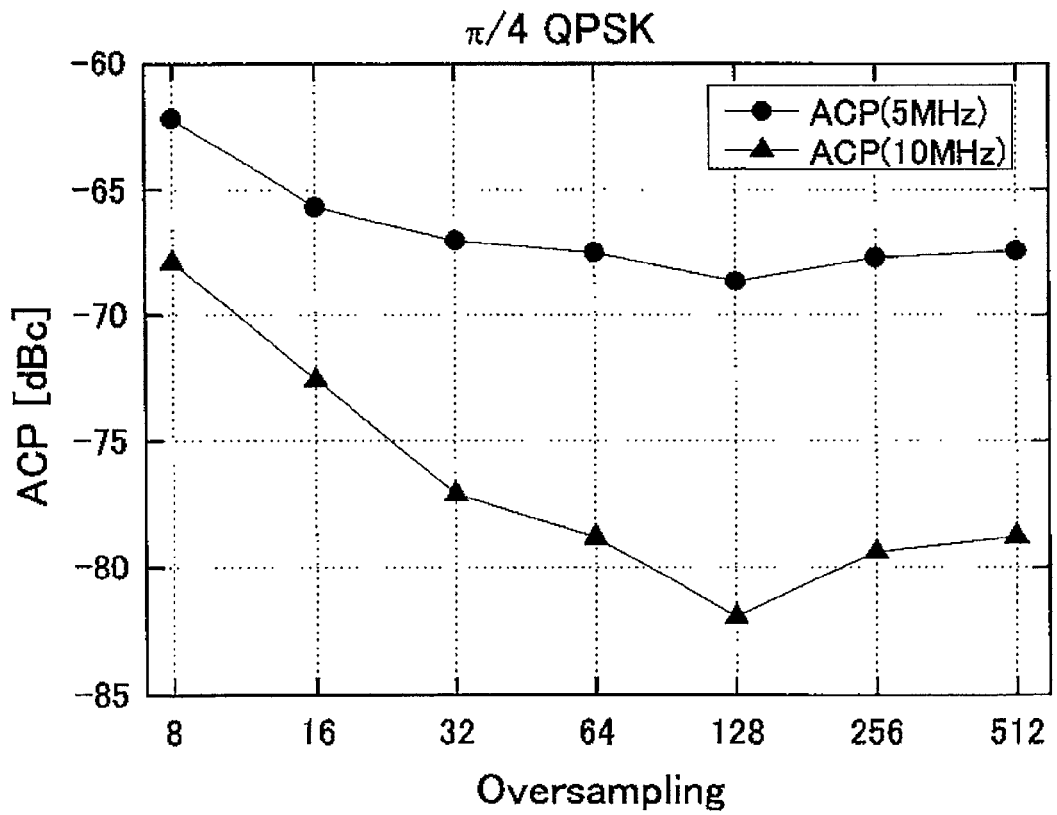
FIG. 12 a diagram showing a simulation result obtained when a clock frequency of the FIR filter is changed.

FIG. 12 is a diagram showing a simulation result obtained when in the transmitter circuit 1, a clock frequency of the FIR filter is changed under same conditions as those in FIG. 28. In FIG. 12, a delay time between the amplitude signal and the phase signal is supposed to be adjusted in an optimum manner (in other words, Delay=0). As shown in FIG. 12, it turns out that the transmitter circuit 1 can greatly reduce distortion using the compensating filter 12 even when the clock frequency is low.

Figure 13:
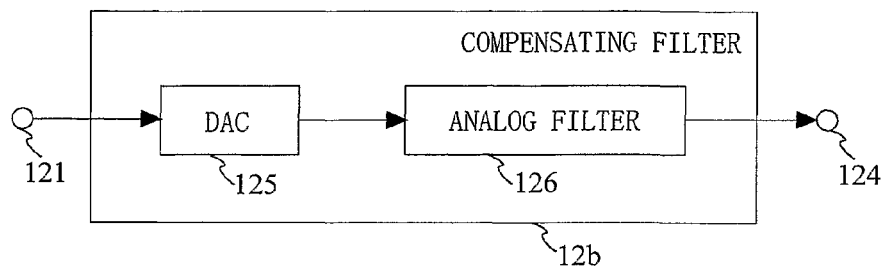
FIG. 13 is a block diagram illustrating an example of a compensating filter 12b including an analog circuit.

And the compensating filter 12 may include, for example, an analog circuit. Also in this case, the compensating filter 12 is designed so as to have an inverse characteristic of the transfer characteristic H(c) from the input at the regulator 14 to the output at the amplitude modulator 15. FIG. 13 is a block diagram illustrating an example of a compensating filter 12b including the analog filter. In FIG. 13, the compensating filter 12b includes an input terminal 121, a DA converter 125, an analog filter 126, and an output terminal 124. The compensating filter 12b converts, using the DA converter 125, the amplitude signal M inputted via the input terminal 121 to an analog signal and compensates using the analog filter 126 and outputs the signal from the output terminal 124.

As described above, in the transmitter circuit 1 according to the first embodiment of the present invention, the compensating filter 12 compensates the amplitude signal outputted by the signal generation section 11 so as to have the inverse characteristic of the transfer characteristic from the input at the regulator 14 to the output at the amplitude modulator section 15, thereby suppressing the distortion caused by the insufficient frequency bandwidth of the regulator 504 and the amplitude modulator section 505. Thus, the transmitter circuit is capable of operating with low distortion and high efficiency even in a modulation method in which modulation bandwidth is wide.

In addition, as compared to the series regulator, the switching regulator, in general, has an advantage of high efficiency, but a disadvantage of narrow band. However, since the transmitter circuit 1 is capable of operating, by using the compensating filter 12, with the low distortion even when the bandwidth is narrow, the highly efficient switching regulator can be applied even in a case where conventionally, modulated bandwidth cannot be ensured without using the series regulator. Hence the transmitter circuit 1 allows power consumption to be greatly reduced.

Second Embodiment

Figure 14A:
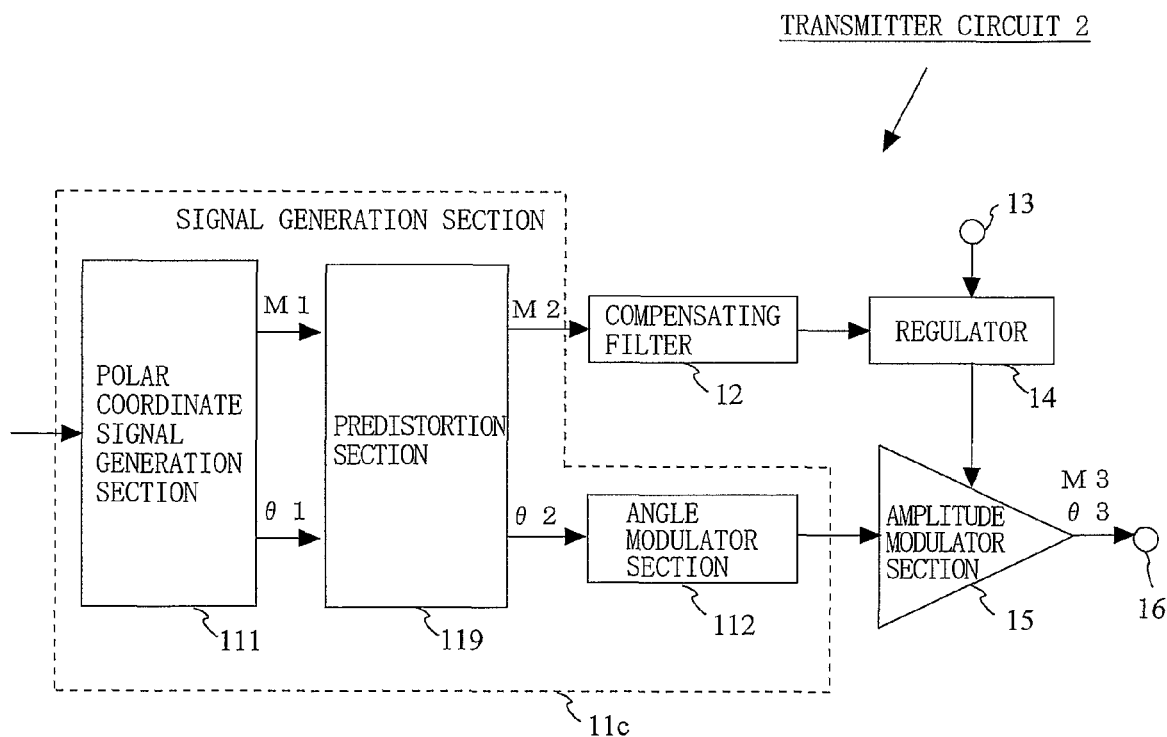
FIG. 14A is a block diagram illustrating an exemplary configuration of a transmitter circuit 2 according to a second embodiment of the present invention.

FIG. 14A is a block diagram illustrating an exemplary configuration of a transmitter circuit 2 according to a second embodiment of the present invention. In FIG. 14A, the transmitter circuit 2 includes a signal generation section whose configuration is different from that in the first embodiment. The signal generation section 11c includes a polar coordinate signal generation section 111, a predistortion section 119, and an angle modulator section 112. In FIG. 14A, the predistortion section 119 compensates an amplitude signal M1 and a phase signal θ1 which are generated by the polar coordinate signal generation section 111 so as to suppress distortion caused in at least any of a regulator 14, an angle modulator section 112, and an amplitude modulator section 15.

Specifically, the predistortion section 119 distorts a previously inputted signal using a predistortion table so as to have an inverse characteristic of a magnitude (AM/AM characteristic) of an envelope of a transmitted signal outputted from the amplitude modulator section 15, with reference to an input signal to a DAC in the compensation filter 12 and to have an inverse characteristic of a phase difference (AM/PM characteristic) between an input and an output at the amplitude modulator section 15, with reference to the input signal to the DAC in the compensation filter 12.

In FIG. 14A, the polar coordinate signal generation section 111 outputs the amplitude signal M1 and the phase signal θ1. The amplitude signal M1 and the phase signal θ1 are inputted to the predistortion section 119. The predistortion section 119 compensates the amplitude signal M1 and the phase signal θ1 based on the previously produced predistortion table and outputs an amplitude signal M2 and a phase signal θ2. Operations performed thereafter are same as those in the first embodiment. In other words, the amplitude signal M2 is inputted to the compensating filter 12, is wave-shaping-processed, and thereafter is inputted to the regulator 14. The phase signal θ2 is inputted to the angle modulator section 112, angle-modulated, and thereafter, inputted to the amplitude modulator section 15.

Hereinafter, a method of producing the predistortion table in the predistortion section 119 will be described. The predistortion section 119 is produced when the transmitter circuit 2 is designed. First, the predistortion section 119 inputs a constant phase θ2 (for example, θ2=0) to the angle modulator section 112. And the predistortion section 119 inputs an amplitude signal M2 of a constant magnitude to the compensating filter 12. The predistortion section 119 measures a magnitude of an envelope of a modulated signal (hereinafter, referred to as an amplitude signal M3) outputted from the amplitude modulator section 15 and a phase component (hereinafter, referred to as a phase signal θ3) of the modulated signal. The predistortion section 119 repeats the above-mentioned processes while changing a magnitude of the amplitude signal M2 inputted to the compensating filter 12. Suppose that characteristics resulting thereupon are as shown in FIG. 15A and FIG. 15B.

Figure 15A:
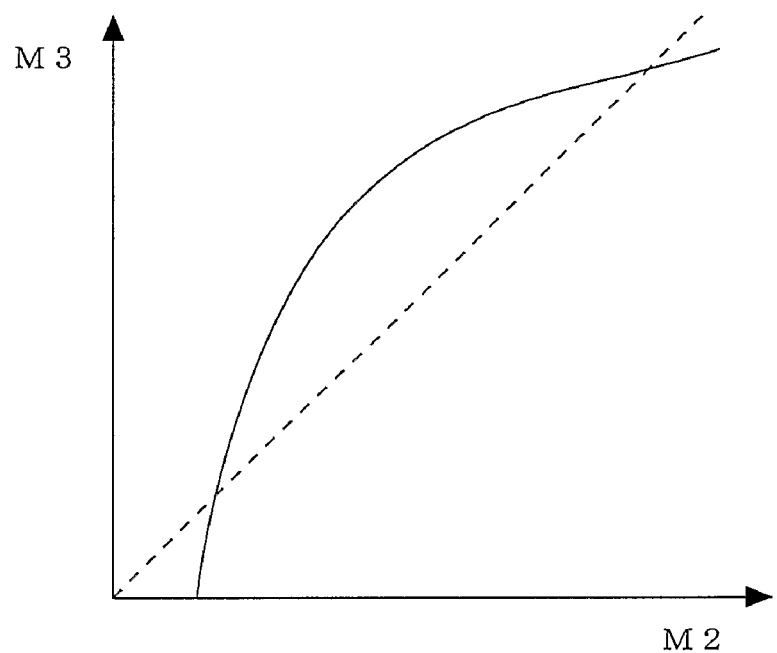
FIG. 15A is a diagram explaining a method for producing a predistortion table in a predistortion section 119.
Figure 15B:
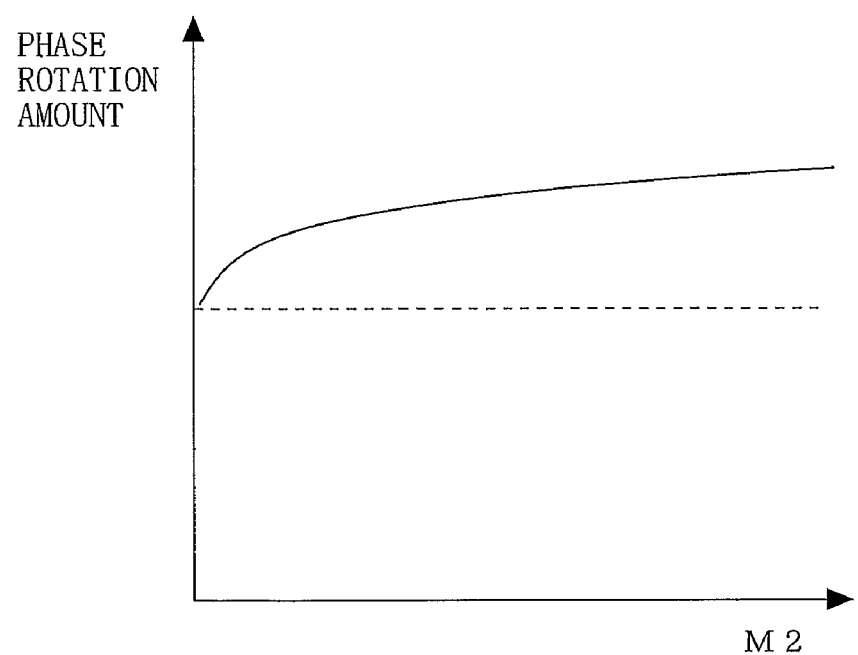
FIG. 15B is a diagram explaining the method for producing the predistortion table in the predistortion section 119.
Figure 16A:
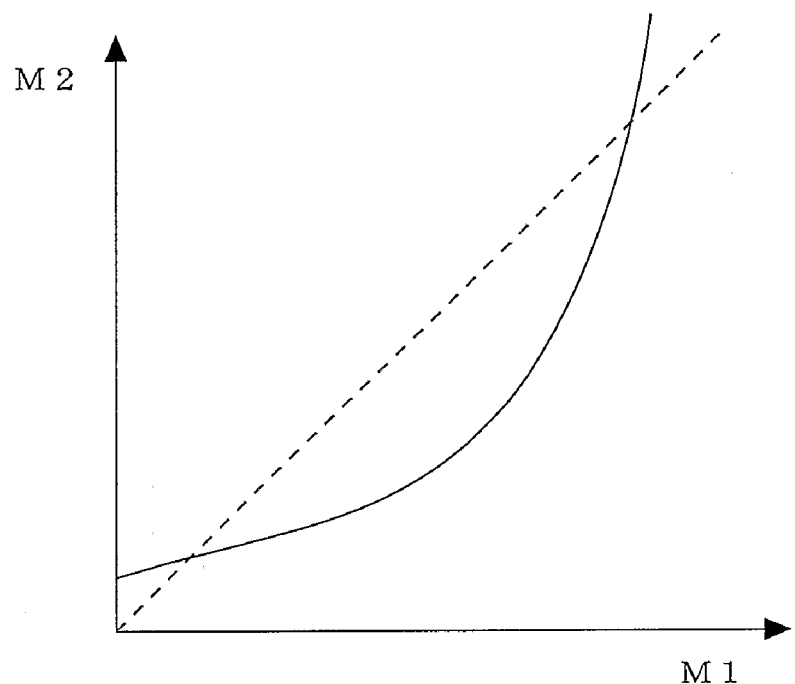
FIG. 16A is a diagram explaining the method for producing the predistortion table in the predistortion section 119.
Figure 16B:
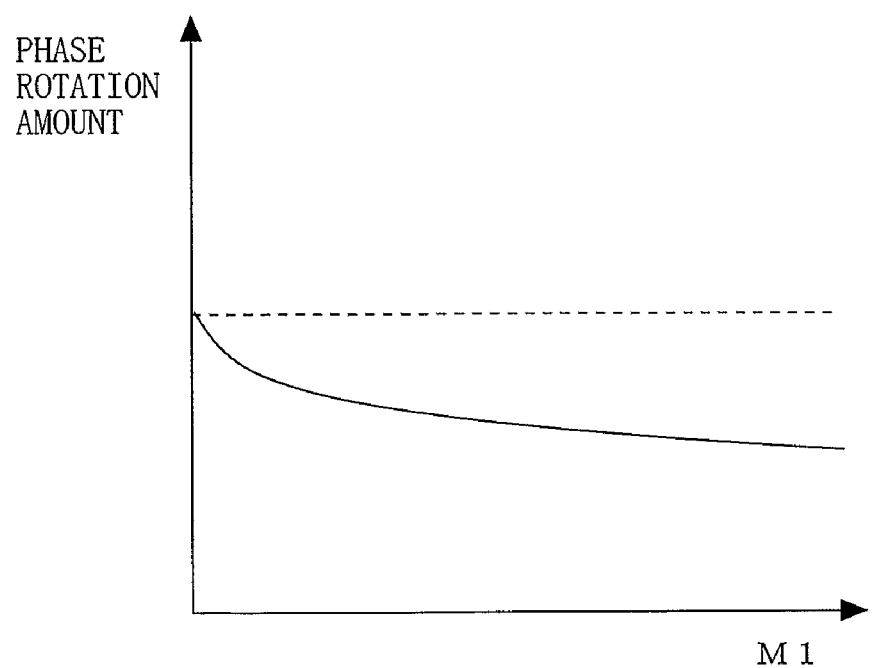
FIG. 16B is a diagram explaining the method for producing the predistortion table in the predistortion section 119.
Figure 17A:
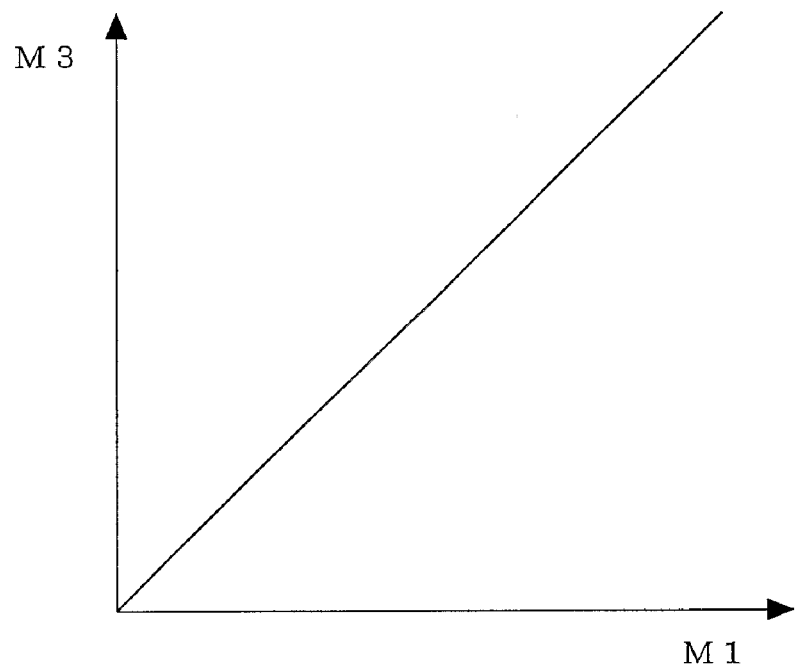
FIG. 17A is a diagram explaining the method for producing the predistortion table in the predistortion section 119.
Figure 17B:
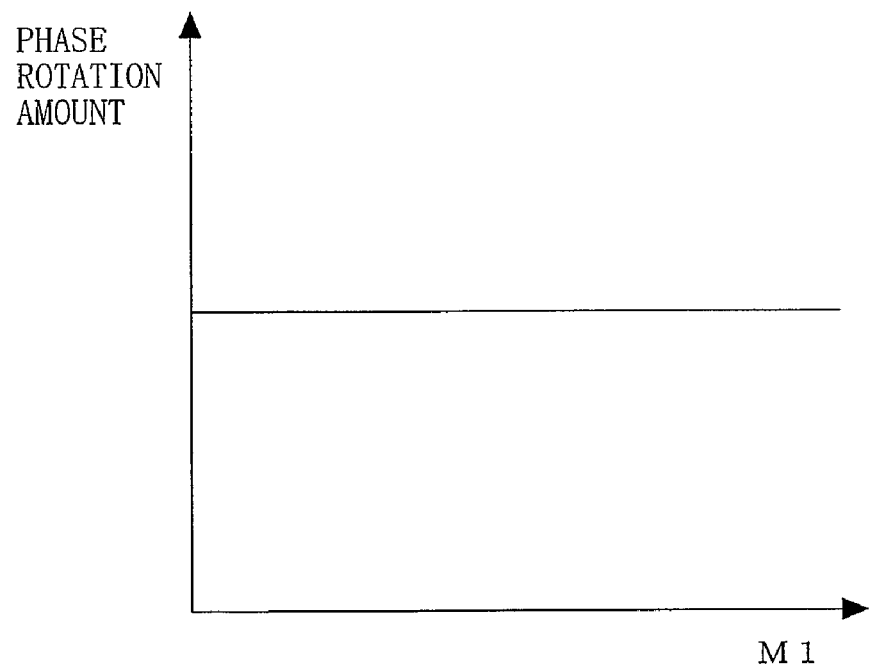
FIG. 17B is a diagram explaining the method for producing the predistortion table in the predistortion section 119.

In such a case, the predistortion section 119 produces the predistortion table for distorting the amplitude signal M1 and the phase signal θ1 so that characteristics are inverse from the characteristics shown in FIG. 15A and FIG. 15B (in other words, so as to be characteristics shown in FIGS. 16A and 16B). Thus, the predistortion section 119 is capable of causing the characteristics of the transmitter circuit 2 to be linear characteristics shown in FIG. 17A and FIG. 17B.

The configuration of the transmitter circuit 2 according to the second embodiment may be different from that shown in FIG. 14A. For example, the configuration of the transmitter circuit 2 according to the second embodiment may be as shown in FIG. 14B. In FIG. 14B, the transmitter circuit 2b includes the predistortion section 119 downstream of the signal generation section 11.

As described above, in the transmitter circuit 2 according to the second embodiment of the present invention, the predistortion section 119 compensates non-linearity of at lease any of the angle modulator section 112, the regulator 14, and the amplitude modulator section 15, and the compensating filter 12 suppresses the distortion caused by the insufficient frequency bandwidth of the regulator 14 and the amplitude modulator section 15, whereby the transmitted signal having the distortion reduced can be outputted.

Third Embodiment

Figure 18:
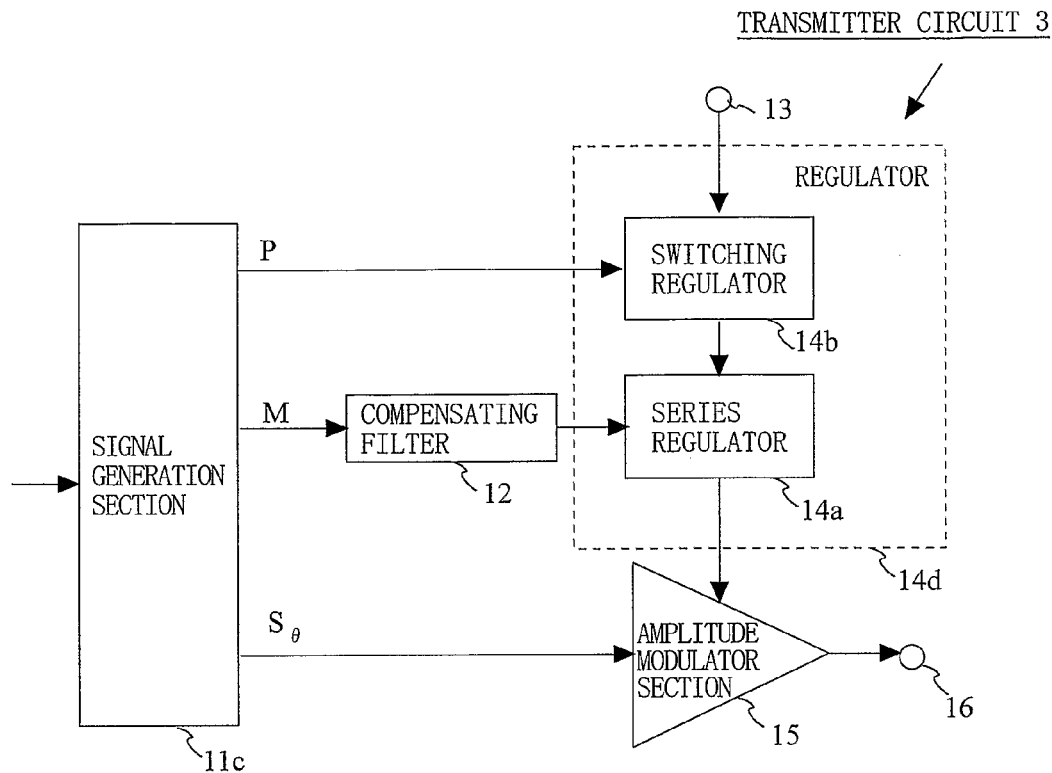
FIG. 18 is a block diagram illustrating an exemplary configuration of a transmitter circuit 3 according to a third embodiment of the present invention.

FIG. 18 is a block diagram illustrating an exemplary configuration of a transmitter circuit 3 according to a third embodiment of the present invention. In FIG. 18, in the transmitter circuit, a signal generation section 11c and a regulator 14d are different from those in the transmitter circuit 1 according to the first embodiment of the present invention. Unlike in the transmitter circuit 1 according to the first embodiment, the signal generation section 11c further outputs power information P which is set based on a base band section of the transmitter circuit 3. The regulator 14d includes a series regulator 14a and a switching regulator 14b. A configuration of the series regulator 14a, for example, is shown in FIG. 14. A configuration of the switching regulator 14b, for example, is shown in FIG. 5.

The power information, for example, in a case of a W-CDMA system, is controlled by a base station. In other words, required power is sent from the base station to the transmitter circuit 3. Based on the power sent from the base station, the power information P is determined. The power information P is inputted to the switching regulator 14b. Supplied to the switching regulator 14b is a DC voltage from a power source terminal 13. The switching regulator 14b supplies a voltage controlled by the power information P to the series regulator 14a. Since a frequency of the power information P is lower than a frequency of an amplitude signal M, the switching regulator 14b can be operated in a highly efficient manner. The voltage outputted from the switching regulator 14b is set so as to be equal to or slightly higher than a maximum value of the voltage outputted from the series regulator 14a.

Since the voltage supplied from the switching regulator 14b is controlled in an optimum manner, the series regulator 14a can operate with high efficiency. Therefore, the transmitter circuit 3, by using the regulator 14b having the series regulator 14a and the switching regulator 14b in combination, reduces a loss at the series regulator 14a and thereby power consumption. And in the transmitter circuit 3, the compensating filter 12 compensates frequency characteristics of the series regulator 14a and the amplitude modulator section 15, thereby allowing linearity of a transmitted signal to be enhanced.

Figure 19:
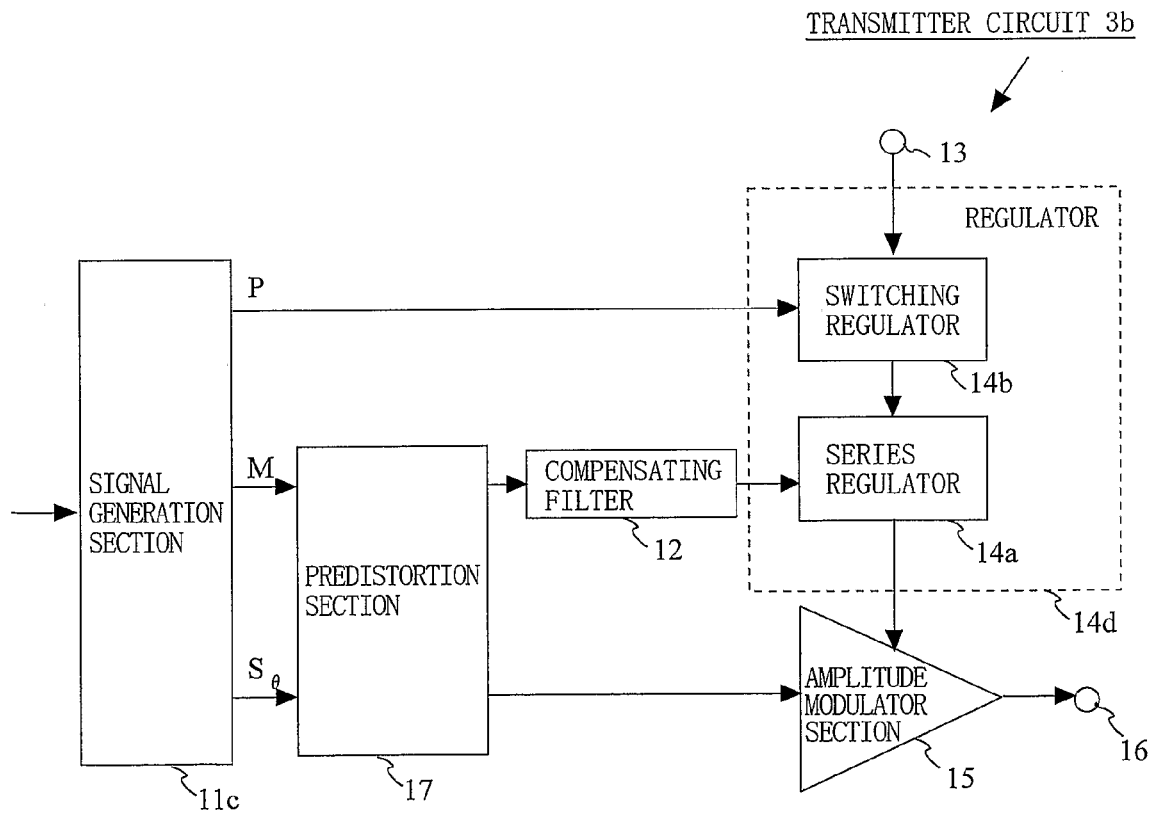
FIG. 19 is a block diagram illustrating an exemplary configuration of a transmitter circuit 3b including a predistortion section 17.

In the meantime, the transmitter circuit 3 may further include the predistortion section 17 described above. FIG. 19 is a block diagram illustrating an exemplary configuration of a transmitter circuit 3b including the predistortion section 17. In FIG. 19, in the transmitter circuit 3b, the predistortion section 17 compensates non-linearity of at least either the series regulator 14a and the amplitude modulator section 15, thereby allowing linearity of the transmitted signal to be further enhanced.

Fourth Embodiment

Figure 20:
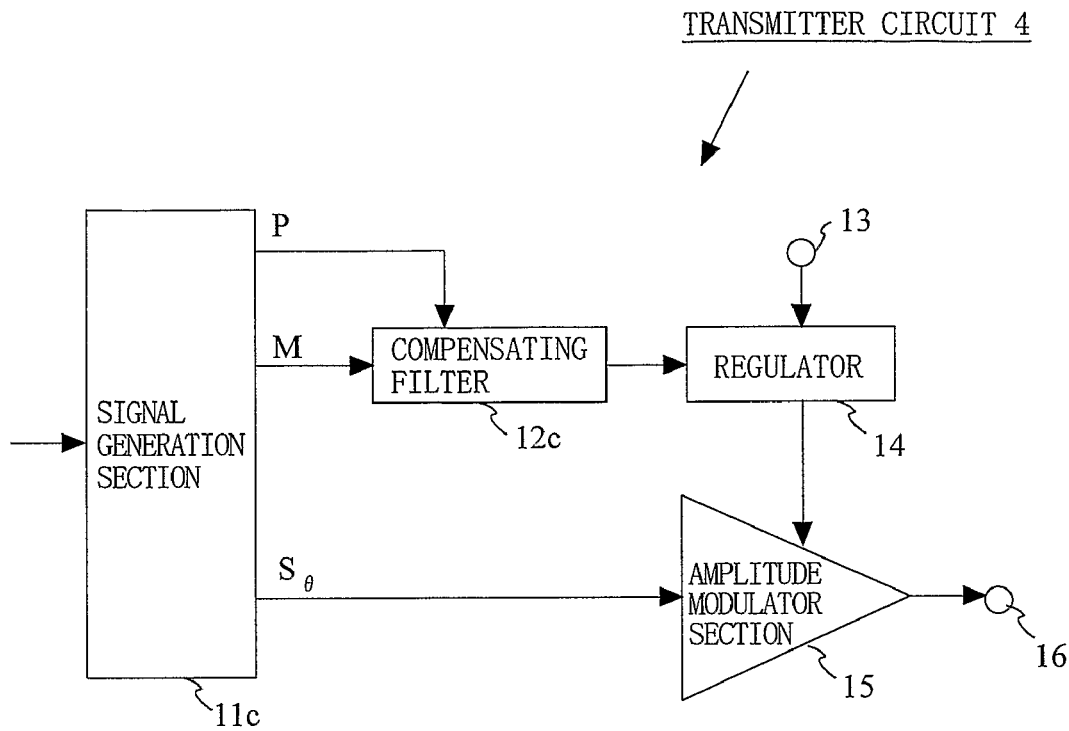
FIG. 20 is a block diagram illustrating an exemplary configuration of a transmitter circuit 4 according to a fourth embodiment of the present invention.

FIG. 20 is a block diagram illustrating an exemplary configuration of a transmitter circuit 4 of a fourth embodiment of the present invention. In FIG. 20, the transmitter circuit 4 includes a signal generation section 11c, a compensating filter 12c, a power source terminal 13, a regulator 14, an amplitude modulator section 15, and an output terminal 16. Inputted to the compensating filter 12c is power information P outputted from the signal generation section 11c. A transfer characteristic from the regulator 14 to the amplitude modulator section 15 may change depending on a magnitude of power of a transmitted signal outputted by the amplitude modulator 15. Therefore, in the transmitted circuit 4, a characteristic of the compensating filter 12c is controlled in an optimum manner in accordance with a magnitude of the power information P outputted from the signal generation section 11c.

Figure 21:
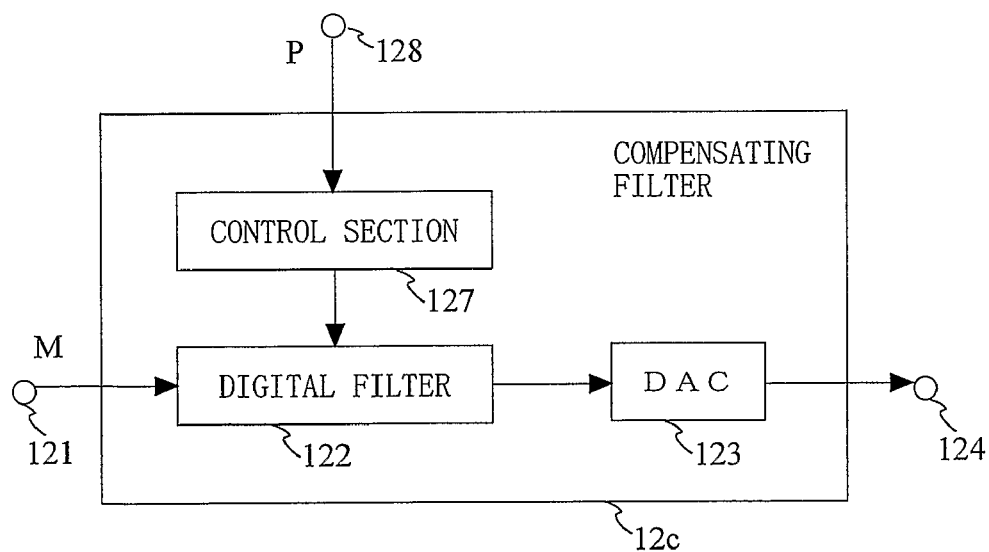
FIG. 21 is a block diagram illustrating an exemplary configuration in detail of a compensating filter 12c.

FIG. 21 is a block diagram illustrating an exemplary configuration in detail of the compensating filter 12c. In FIG. 21, the compensating filter 12c includes an input terminal 121, a digital filter 122, a DA converter 123, a control section 127, and an output terminal 128. Inputted to the input terminal 12 is an amplitude signal M. The compensating filter 12c compensates, using the digital filter 122 the amplitude signal M inputted via the input terminal 121 and converts, using the DA converter 123, the signal to an analog signal to be outputted from the output terminal 124. And inputted to the input terminal 128 is power information P. In the control section 127, a table in which pieces of the power information P each respectively correspond to one of tap coefficients of the digital filter is stored. Based on the inputted power information P and this table, the control section 127 controls the tap coefficient of the digital filter 122. Thus, irrespective of a magnitude of power of a transmitted signal outputted by the amplitude modulator section 15, the transmitter circuit 4 can suppress distortion caused by insufficient frequency bandwidth of the regulator 14 and the amplitude modulator section 15.

The transmitter circuit 4 may include an analog filter, instead of the compensating filter 12c, having a variable capacitor. In such a case, in the control section 127, a table in which pieces of the power information P each respectively correspond to one of capacitances of the variable capacitor is stored. Based on the inputted power information P and this table, the control section 127 controls the capacitance of the variable capacitor of the digital filter 122.

Figure 22:
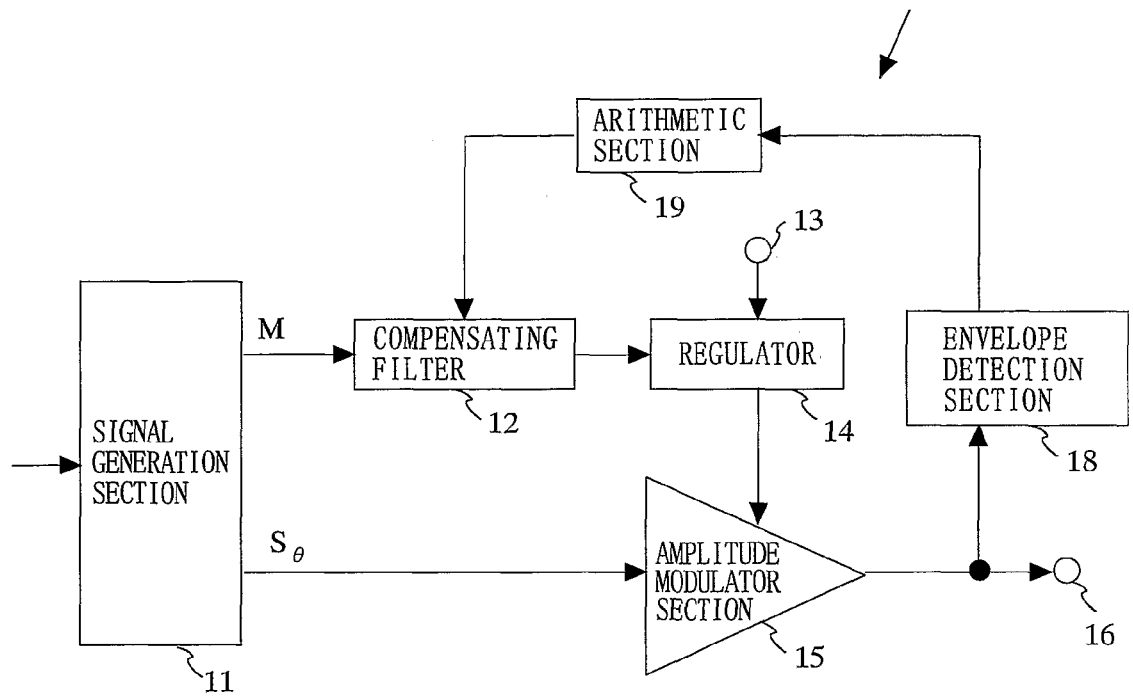
FIG. 22 is a block diagram illustrating an exemplary configuration of a transmitter circuit 4b in which a characteristic of a compensating filter 12 is optimized based on a magnitude of an envelope of a transmitted signal.

The transmitter circuit 4 may optimize a characteristic of the compensating filter 12 based on a magnitude of an envelope, instead of the power information P, of a transmitted signal outputted by the amplitude modulator section 15. FIG. 22 is a block diagram illustrating an exemplary configuration of the transmitter circuit 4b in which the characteristic of the compensating filter 12 is optimized based on the magnitude of the envelope of the transmitted signal. In FIG. 22, the transmitter circuit 4b further includes an envelope detection section 18 and an arithmetic section 19. The envelope detection section 18 detects the magnitude of the envelope of the transmitted signal outputted by the amplitude modulator section 15. Based on the magnitude of the detected envelope of the transmitted signal, the arithmetic section 19 updates a coefficient of the compensating filter 12c.

And the transmitter circuit 4b may update the coefficient of the compensating filter 12c by generating a test signal when a power source is turned on and detecting a transfer characteristic of a system using the test signal. As the test signal, a step signal, an impulse signal or the like may be used.

Also owing to the above-mentioned feature, irrespective of the magnitude of power of the transmitted signal outputted by the amplitude modulator section 15, the transmitter circuit 4b is capable of suppressing the distortion caused by the insufficient frequency bandwidth of the regulator 14 and the amplitude modulator section 15. In addition, based on the magnitude of the detected envelope of the transmitted signal outputted by the amplitude modulator section 15, the transmitter circuit 4b optimizes a characteristic of the compensating filter 12, thereby suppressing distortion caused by aging degradation. In addition, the transmitter circuit 4b updates the coefficient of the compensating filter 12, thereby enabling a reduction in a memory amount used for the compensating filter 12.

Figure 23:
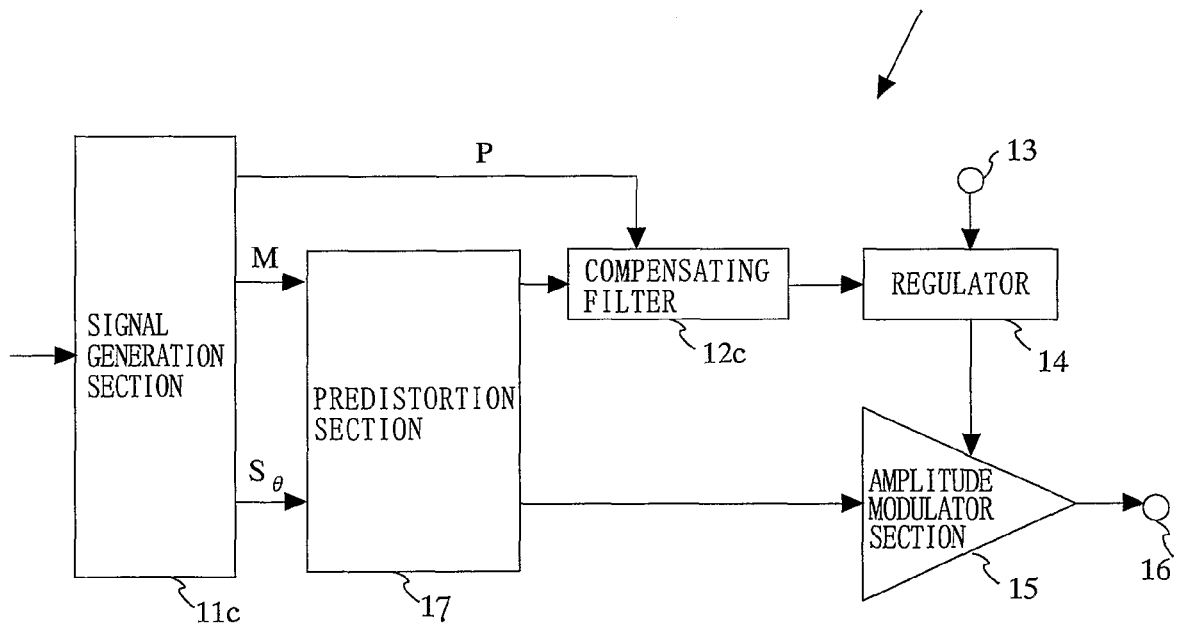
FIG. 23 is a block diagram illustrating an exemplary configuration of a transmitter circuit 4c including a predistortion section 17.

And the transmitter circuit 4 may further include the above-described predistortion section 17. FIG. 23 is a block diagram illustrating an exemplary configuration of a transmitter circuit 4c including the predistortion section 17. In FIG. 23, the predistortion section 17 in the transmitter circuit 14c compensates non-linearity of either of the regulator 14 and the amplitude modulator section 15, whereby linearity of a transmitted signal is further enhanced.

Figure 24:
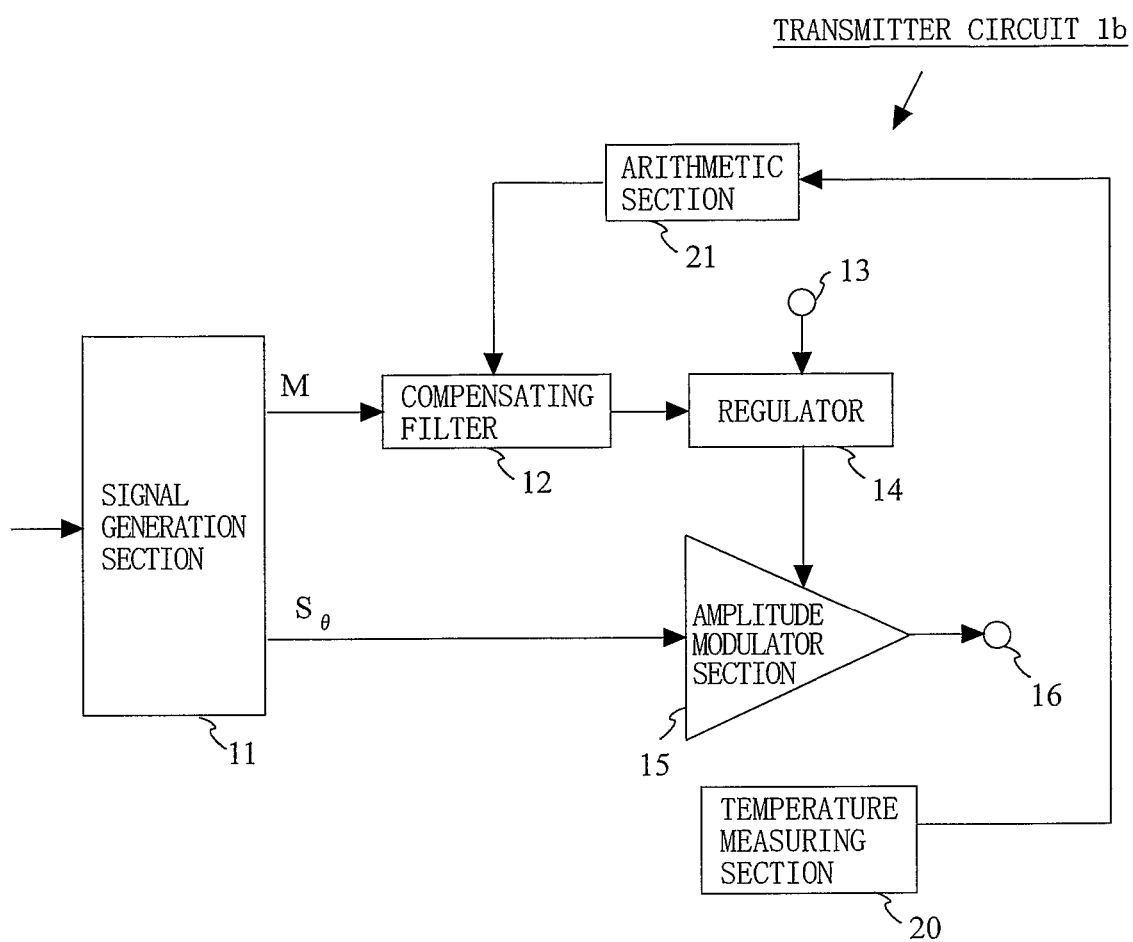
FIG. 24 is a block diagram illustrating an exemplary configuration of a transmitter circuit 1b in which a characteristic of the compensating filter 12 is optimized based on a temperature of the amplitude modulator section 15.

The transmitter circuit according to the first, the second, the third, or the fourth embodiments may optimize the characteristic of the compensating filter 12 in accordance with a temperature of the amplitude modulator section 15. FIG. 24 is a block diagram illustrating an exemplary configuration of a transmitter circuit 1b which optimizes the characteristic of the compensating filter 12 in accordance with the temperature of the amplitude modulator section 15. In FIG. 24, the transmitter circuit 1b further includes a temperature measuring section 20 and an arithmetic section 21. The temperature measuring section 20 measures the temperature of the amplitude modulator section 15. The temperature measuring section 20 may be located in vicinity to the amplitude modulator section 15 or mounted on a chip where a transistor, as the amplitude modulator section 15, is mounted. The arithmetic section 21 optimizes the characteristic of the compensating filter 12 in accordance with the temperature, measured by the temperature measuring section 20, of the amplitude modulator 15. Thus, even if the temperature of the amplitude modulator section 15 changes, the transmitter circuit is capable of suppressing the distortion caused by the insufficient frequency bandwidth of the regulator 14 and the amplitude modulator section 15.

Fifth Embodiment

Figure 25:
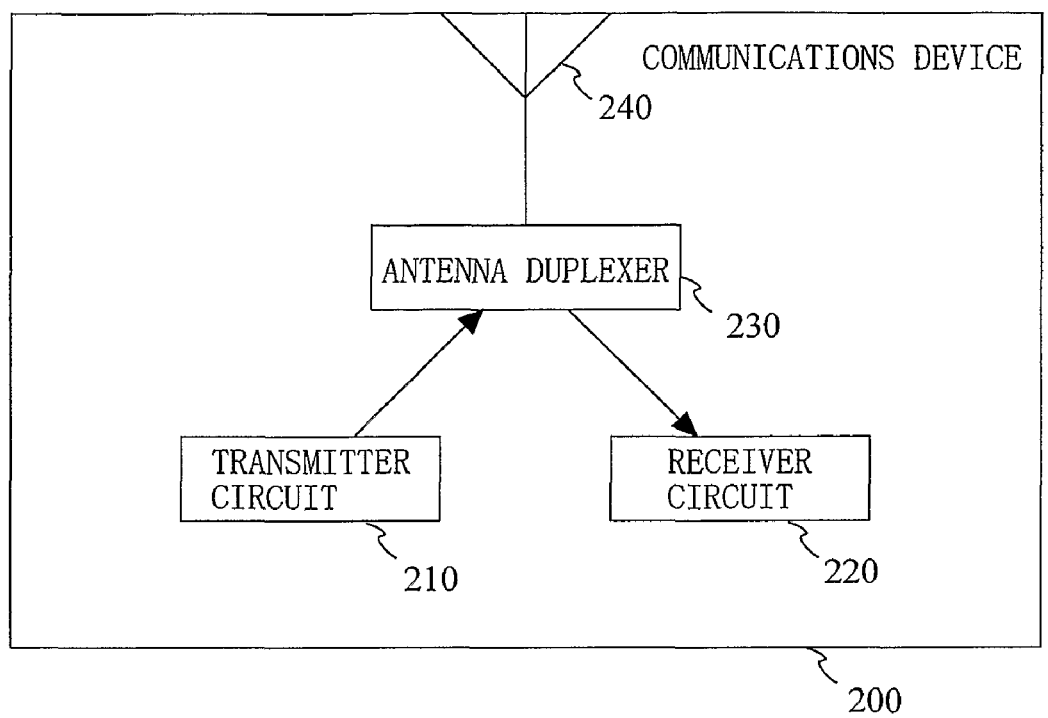
FIG. 25 is a block diagram illustrating an exemplary configuration of a communications device according to a fifth embodiment of the present invention.

FIG. 25 is a block diagram illustrating an exemplary configuration of a communications device according to a fifth embodiment of the present invention. In FIG. 25, the communications device 200 includes a transmitter circuit 210, a receiver circuit 220, an antenna duplexer 230, and an antenna 240. The transmitter circuit 210 is any of the above-described transmitter circuits according to the first, the second, the third, and the fourth embodiments. The antenna duplexer 220 transfers a transmitted signal outputted from the transmitter circuit 210 to the antenna 240 and prevents the transmitted signal from leaking into the receiver circuit 220. And the antenna duplexer 230 transfers a received signal inputted from the antenna 240 to the receiver circuit 220 and prevents the received signal from leaking into the transmitter circuit 210.

Accordingly, the transmitted signal is outputted from the transmitter circuit 210 and via the antenna duplexer 230, released to the space from the antenna 240. The received signal is received by the antenna 240 and via the antenna duplexer 230, received by the receiver circuit 220. The communications device 200 according to the fifth embodiment, by using any of the transmitter circuits according to the first, the second, the third, and the fourth embodiments, can ensure linearity of the transmitted signal, but at the same time can, as a wireless device, realize low distortion. In addition, because downstream of an output from the transmitter circuit 210, there is no branching element such as a directional coupler; a loss from the transmitter circuit 210 to the antenna 240 can be reduced, thereby reducing power consumption upon transmitting and enabling the wireless communications device to be used for a long period of time. The communications device 200 may include only the transmitter circuit 210 and the antenna 240.

INDUSTRIAL APPLICABILITY

A transmitter circuit according to the present invention is applicable to a communications device such as a mobile phone and a wireless LAN device.

The invention claimed is:

1. A transmitter circuit operable to generate and output a transmitted signal based on inputted data, comprising:
   a signal generation section for generating an amplitude signal and an angle-modulated signal based on an amplitude component and a phase component which are obtained by signal-processing the inputted data;
   a compensating filter for wave-shaping-processing the amplitude signal based on a predetermined characteristic of the compensating filter;
   a regulator for outputting a signal in accordance with a magnitude of the signal which has been wave-shaping-processed by the compensating filter; and
   an amplitude modulator section for, using the signal outputted from the regulator, amplitude-modulating the angle-modulated signal to be outputted as a modulated signal therefrom, wherein
   the predetermined characteristic of the compensating filter is an inverse of a transfer characteristic between an input at the regulator and an output at the amplitude modulator section.

2. The transmitter circuit according to claim 1, wherein the signal generation section includes:
   a polar coordinate signal generation section for generating the amplitude signal and a phase signal based on the amplitude component and the phase component which are obtained by signal-processing the data, and
   an angle modulator section for angle-modulating the phase signal to be outputted as the angle-modulated signal therefrom.

3. The transmitter circuit according to claim 2, further including, downstream of an output from the polar coordinate generation section, a predistortion section for compensating distortion, of at least either one of the amplitude signal and the phase signal, caused at any of the regulator, the angle modulator section, and the amplitude modulator section.

4. The transmitter circuit according to claim 1, wherein the signal generation section includes:
   a quadrature signal generation section for generating an in-phase signal and a quadrature-phase signal by signal-processing the data;
   a vector modulator section for vector-modulating the in-phase signal and the quadrature-phase signal;
   an envelope detection section for detecting an envelope component of the signal outputted from the vector modulator section and outputting the detected component as the amplitude signal; and
   a limiter for limiting, to a predetermined magnitude, an envelope of the signal outputted from the vector modulator section and outputting, as the angle-modulated signal, the signal whose magnitude is limited.

5. The transmitter circuit according to claim 1, wherein the compensating filter includes:
   a digital filter for wave-shaping-processing the amplitude signal based on the predetermined characteristic of the compensating filter and
   a DA converter for converting to an analog signal the signal outputted from the digital filter.

6. The transmitter circuit according to claim 1, wherein the compensating filter includes:
   a DA converter for converting the amplitude signal to the analog signal and
   an analog filter for wave-shaping-processing the analog signal based on the predetermined characteristic of the compensating filter.

7. The transmitter circuit according to claim 1, wherein the regulator is a series regulator.

8. The transmitter circuit according to claim 1, wherein the regulator is a switching regulator.

9. The transmitter circuit according to claim 1, wherein the signal generation section further outputs power information which is set based on a baseband section of the transmitter circuit,
   the regulator includes a switching regulator and a series regulator,
   the switching regulator supplies to the series regulator a voltage controlled by the power information, and
   the series regulator, to which the voltage is supplied from the switching regulator, outputs a signal in accordance with a magnitude of the signal which has been wave-shaping-processed by the compensating filter.

10. The transmitter circuit according to claim 1, wherein a transfer characteristic of the compensating filter is constant irrespective of a magnitude of the amplitude signal.

11. The transmitter circuit according to claim 1, wherein
the signal generation section further outputs the power information which is set on the base band section of the transmitter circuit and
the transfer characteristic of the compensating filter is changed in accordance with a magnitude of the power information.

12. A communications device comprising:
a transmitter circuit for generating a transmitted signal and
an antenna for outputting the transmitted signal generated by the transmitter circuit, wherein
the transmitter circuit is the transmitter circuit according to claim 1.

13. The communications device according to claim 12, comprising:
a receiver circuit for processing a received signal received from the antenna and
an antenna duplexer for outputting to the antenna the transmitted signal generated in the transmitter circuit and outputting to the receiver circuit the received signal received from the antenna.

* * * * *